US010528687B2

(12) United States Patent
Johnson et al.

(10) Patent No.: US 10,528,687 B2
(45) Date of Patent: Jan. 7, 2020

(54) VIRTUAL OSCILLATOR CONTROL

(71) Applicants: Alliance for Sustainable Energy, LLC, Golden, CO (US); Regents of the University of Minnesota, Minneapolis, MN (US); ETH Zürich, Zürich (CH)

(72) Inventors: Brian Benjamin Johnson, Denver, CO (US); Nathan Ainsworth, Brown Deer, WI (US); Sairaj Vijaykumar Dhople, Minneapolis, MN (US); Mohit Sinha, St. Paul, MN (US); Florian Anton Dörfler, Zürich (CH)

(73) Assignees: Alliance for Sustainable Energy, LLC, Golden, CO (US); ETH Zürich, Zürich (CH)

( * ) Notice: Subject to any disclaimer, the term of this patent is extended or adjusted under 35 U.S.C. 154(b) by 172 days.

(21) Appl. No.: 15/581,824

(22) Filed: Apr. 28, 2017

(65) Prior Publication Data
US 2017/0316135 A1    Nov. 2, 2017

Related U.S. Application Data

(60) Provisional application No. 62/329,266, filed on Apr. 29, 2016, provisional application No. 62/373,078, filed on Aug. 10, 2016.

(51) Int. Cl.
*G06F 17/50* (2006.01)
*G01R 19/25* (2006.01)
(Continued)

(52) U.S. Cl.
CPC ..... *G06F 17/5036* (2013.01); *G01R 19/2513* (2013.01); *G01R 21/133* (2013.01);
(Continued)

(58) Field of Classification Search
CPC ........................................................ H02M 7/00
See application file for complete search history.

(56) References Cited

U.S. PATENT DOCUMENTS

| 8,093,758 B2 | 1/2012 | Hussmann et al. |
| 8,964,424 B2 | 2/2015 | Sakakibara |
| (Continued) | | |

OTHER PUBLICATIONS

Dumitrescu, Iulia, et al. "Modeling and characterization of oscillator circuits by Van Der Pol model using parameter estimation." Journal of Circuits, Systems, and Computers 21.05 (2012): 1250043. (Year: 2012).*

(Continued)

*Primary Examiner* — Omar F Fernandez Rivas
*Assistant Examiner* — David A Hopkins
(74) *Attorney, Agent, or Firm* — Robert G. Pittelkow

(57) ABSTRACT

Virtual oscillator control systems, devices, and techniques are provided. One example device includes a processor configured to implement a virtual oscillator circuit and output an oscillating waveform based on the virtual oscillator circuit and power electronics operatively coupled to the processor and configured to convert, based on the oscillating waveform, direct current (DC) electricity to alternating current (AC) electricity. The processor may be further configured to extract, from the virtual oscillator circuit, a virtual current based on an output current of the AC electricity, and output the oscillating waveform further based on an input voltage of the DC electricity.

13 Claims, 11 Drawing Sheets

(51) Int. Cl.
| | |
|---|---|
| G01R 21/133 | (2006.01) |
| G01R 35/04 | (2006.01) |
| G06F 1/28 | (2006.01) |
| G06F 1/30 | (2006.01) |
| G06F 17/40 | (2006.01) |
| G01R 31/42 | (2006.01) |

(52) U.S. Cl.
CPC ............ *G01R 31/42* (2013.01); *G01R 35/04* (2013.01); *G06F 1/28* (2013.01); *G06F 1/30* (2013.01); *G06F 17/40* (2013.01); *G06F 17/5045* (2013.01); *G06F 17/5063* (2013.01)

(56) References Cited

U.S. PATENT DOCUMENTS

| | | |
|---|---|---|
| 9,484,745 B2 | 11/2016 | Johnson et al. |
| 2011/0110132 A1 | 5/2011 | Rausch et al. |
| 2011/0115454 A1 | 5/2011 | Benedict et al. |
| 2011/0169471 A1 | 7/2011 | Nagasawa |
| 2013/0241511 A1 | 9/2013 | Xi |
| 2014/0176097 A1 | 6/2014 | Huang |
| 2015/0009719 A1 | 1/2015 | Ho et al. |
| 2015/0070948 A1* | 3/2015 | Johnson .................... H02J 3/38 363/41 |
| 2015/0188406 A1 | 7/2015 | Nishi et al. |
| 2018/0323714 A1 | 11/2018 | Johnson et al. |

OTHER PUBLICATIONS

Sinha, Mohit, et al. "Nonlinear supersets to droop control." Control and Modeling for Power Electronics (COMPEL), 2015 IEEE 16th Workshop on. IEEE, 2015. (Year: 2015).*

Johnson, Brian B., et al. "Synthesizing virtual oscillators to control islanded inverters." IEEE Transactions on Power Electronics 31.8 (2015): 6002-6015. (Year: 2015).*

Johnson, Brian B., et al. "Oscillator-based inverter control for islanded three-phase nnicrogrids." IEEE Journal of Photovoltaics 4.1 (2014): 387-395. (Year: 2014).*

Dhople, Sairaj V., Brian B. Johnson, and Abdullah O. Hamadeh. "Virtual Oscillator Control for voltage source inverters." Communication, Control, and Computing (Allerton), 2013 51st Annual Allerton Conference on. IEEE, 2013. (Year: 2013).*

Johnson, Brian.;Control, analysis, and design of distributed inverter systems. Diss. University of Illinois at Urbana-Champaign, 2013. (Year: 2013).*

Tu, Yong, et al. "Improved virtual oscillator control for parallel operation inverter systems." 2016 IEEE 8th International Power Electronics and Motion Control Conference (IPEMC—ECCE Asia). IEEE, 2016. (Year: 2016).*

International Search Report and Written Opinion for International (PCT) Application No. PCT/US17/30119, pp. 1-10, dated Sep. 22, 2017.

Johnson et al., "Synthesizing Virtual Oscillators to Control Islanded Inverters", IEEE Transactions on Power Electronics, Aug. 2016, vol. 31, No. 8, pp. 6002-6015.

Sinha et al., "Nonlinear Supersets to Droop Control", 2015 IEEE 16th Workshop on Control and Modeling for Power Electronics (COMPEL), Jul. 2015, pp. 1-6.

Sinha et al., "Synchronization of Liénard-type Oscillators in Uniform Electrical Networks", 2016 American Control Conference (ACC), Jul. 2016, pp. 4311-4316.

"Telecom Power System Market by Grid Type (On Grid, Off Grid, Bad Grid), Component (Rectifier, Inverter, Converter, Controller, Generator), Power Source (Diesel-Battery, Diesel-Solar, Diesel-Wind, Multiple Sources), and Geography—Global Forecast to 2022", Markets and Markets, published Mar. 2017, available at https://www.marketsandmarkets.com/Market-Reports/telecom-power-system-market-218058881.html, accessed Jun. 6, 2018, pp. 1-4.

"Data Center Power Market Analysis by Product (PDU, UPS, Busway), by End-use (IT & Telecommunications, BFSI, Government, Energy, Healthcare, Retail), by Region, and Segment Forecasts, 2018-2025", Grand View Research, published Jul. 2017, available at https://www.grandviewresearch.com/industry-analysis/data-center-power-market, accessed Jun. 5, 2018, pp. 1-9.

"DC-DC Converters Market worth 268.2 Million USD by 2020", Press Release, Markets and Markets, available at https://www.marketsandmarkets.com/PressReleases/dc-dc-converter.asp, accessed Jun. 5, 2018, pp. 1-3.

Haug, "Multiphase DC/DC Converters Save Power in Data Centers", Power Electronics Europe, 2011, Issue 5, pp. 33-35.

Krein, "Data Center Challenges and Their Power Electronics", CPSS Transactions on Power Electronics and Applications, Mar. 2017, vol. 2, No. 1, pp. 39-46.

Sinha et al., "Decentralized Interleaving of Paralleled Dc-Dc Buck Converters", 2017 IEEE 18th Workshop on Control and Modeling for Power Electronics (COMPEL), Jul. 2017, pp. 1-6.

* cited by examiner

VIRTUAL OSCILLATOR CONTROL

CROSS-REFERENCE TO RELATED APPLICATIONS

This application claims the benefit of U.S. Provisional Application No. 62/329,266, filed "VIRTUAL OSCILLATOR CONTROL FOR POWER ELECTRONICS INVERTERS" and filed Apr. 29, 2016, and U.S. Provisional Application No. 62/373,078, titled "VIRTUAL-OSCILLATOR-BASED POWER-TRACKING CONTROLLER" and filed Aug. 10, 2016, the entire content of each of which is incorporated herein by reference.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

This invention was made with government support under ECCS-1453921 and ECCS-1509277 awarded by the National Science Foundation. The government has certain rights in the invention.

This invention was made with government support under N00014-14-1-0639 awarded by the Office of Naval Research. The government has certain rights in the invention.

BACKGROUND

A power-electronic inverter, or inverter, is an electronic device or circuitry that converts direct current (DC) to alternating current (AC). As one example application, inverters may be used in electricity generation and distribution, converting generated DC power (e.g., from photovoltaic devices) into AC power that can be fed into a power grid. Power grids can be large-scale grids, managed by utility companies and other entities, or smaller, community-scale grids, sometimes referred to as microgrids.

Microgrids are small-scale versions of the centralized power grid. In some examples, microgrids may be able to connect to and disconnect from the centralized power grid, operating in a grid-connected or islanded state, respectively. Microgrids may provide various benefits, such as bringing electricity to areas unconnected to the centralized power grid, fostering community involvement in energy production and management, reducing energy costs, and/or reducing environmental impact of energy generation.

SUMMARY

In one example, a device includes a processor configured to implement a virtual oscillator circuit and output an oscillating waveform based on the virtual oscillator circuit and power electronics operatively coupled to the processor and configured to convert, based on the oscillating waveform, direct current (DC) electricity to alternating current (AC) electricity. The processor is further configured to extract, from the virtual oscillator circuit, a virtual current based on an output current of the AC electricity, and output the oscillating waveform further based on an input voltage of the DC electricity.

In another example, a device includes a processor configured to implement a virtual oscillator circuit that includes a virtual capacitor, a virtual inductor, a virtual negative-conductance element, and a virtual cubic voltage dependent current source. The processor is further configured to generate, based on the virtual oscillator circuit, an oscillating waveform and output, based on the oscillating waveform, at least one control signal to cause power electronics to convert direct current (DC) electricity to alternating current (AC) electricity, receive an indication of an output current of the AC electricity, extract, from the virtual oscillator circuit, a virtual current based on the output current of the AC electricity, and receive an indication of an input voltage of the DC electricity. The oscillating waveform is generated further based on the input voltage of the DC electricity.

In another example, a method includes determining, for a processor operatively coupled to power electronics configured to convert direct current (DC) electricity to alternating current (AC) electricity, based on a specified open-circuit voltage value for the power electronics, a voltage scaling factor value. The processor is configured to implement a virtual oscillator circuit comprising a virtual capacitor, a virtual inductor, a virtual negative-conductance element and a virtual cubic voltage-dependent current source. The method also includes configuring the processor to scale, using the voltage scaling factor value, a virtual oscillator output voltage of the virtual oscillator circuit thereby producing a scaled virtual oscillator output voltage for use in controlling the power electronics, determining, for the processor, based on a specified rated power output value for the power electronics and a specified rated-power voltage value for the power electronics that corresponds to the specified rated power output value, a current scaling factor value, and configuring the processor to generate a virtual oscillator input current by scaling, using the current scaling factor value, an output current of the power electronics. The method also includes determining, for the processor, based on the specified open-circuit voltage value for the power electronics and the specified rated-power voltage value for the power electronics, a conductance value, configuring the processor to implement the virtual negative-conductance element based on the conductance value, determining, for the processor, based on the conductance value, a cubic coefficient value, and configuring the processor to implement the virtual cubic voltage-dependent current source based on the cubic coefficient value. The method additionally includes determining, for the processor, a capacitance value based on at least one of: (i) a specified rated reactive-power output value for the power electronics, (ii) a specified maximum frequency offset value, (iii) the specified rated power output value for the power electronics, (iv) the specified open-circuit voltage value for the power electronics, (v) the specified rated-power voltage value for the power electronics, (vi) a specified rise time value, (vii) a specified nominal system frequency value, or (viii) a specified ratio of an amplitude of a third harmonic to an amplitude of a fundamental, configuring the processor to implement the virtual capacitor based on the capacitance value, determining, for the processor, based on the capacitance value and the specified nominal system frequency value, an inductance value, and configuring the processor to implement the virtual inductor based on the inductance value.

The details of one or more examples are set forth in the accompanying drawings and the description below. Other features, Objects, and advantages will be apparent from the description and drawings, and from the claims.

DETAILED DESCRIPTION

The present disclosure provides systems, devices, and methods for rapidly stabilizing arbitrary initial conditions and load transients to a stable limit cycle using virtual oscillator control (VOC). For example, the techniques described herein may allow a plurality of oscillating signal generators, such as power-electronic inverters connected to an electrical network (e.g., a microgrid), to synchronize with one another without centralized management or communication among the signal generators. Instead, each signal generator may use local measurements and local control actions such that system-wide synchronization is obtained.

In another aspect, the present disclosure provides a formalized design approach for implementing VOC to meet required design specifications. That is, the present disclosure also provides for the design of the virtual oscillators that underpin the control techniques described herein. This may be referred to herein as the oscillator synthesis problem.

In yet another aspect, the present disclosure provides a suite of extensions to VOC, including the ability to trade off real power for frequency and/or trade off reactive power for voltage amplitude, as may be desirable in inductive networks. Additionally, the suite of extensions to VOC described herein also provides improvements to such formalized design approaches, which may pave the way for multi-mode (grid-connected and islanded) operation.

The techniques of the present disclosure are described herein with respect to power-electronic inverters, such as those operating in a microgrid. However, these techniques may also be applicable to various other areas such as standalone systems for remote power applications, uninterruptible AC power supplies, forward operating base power systems, or in any other systems that would benefit from fast, self-referential synchronization of multiple oscillating signals. Furthermore, Van der Pol oscillators are primarily discussed herein. However, the techniques of the present disclosure may be applied using any of a family of weakly nonlinear, limit-cycle oscillators, such as the Liénard oscillator and others. Hereinafter, inverters controlled in accordance with the present disclosure are termed virtual-oscillator controlled (VO-controlled) inverters.

Figure 1:
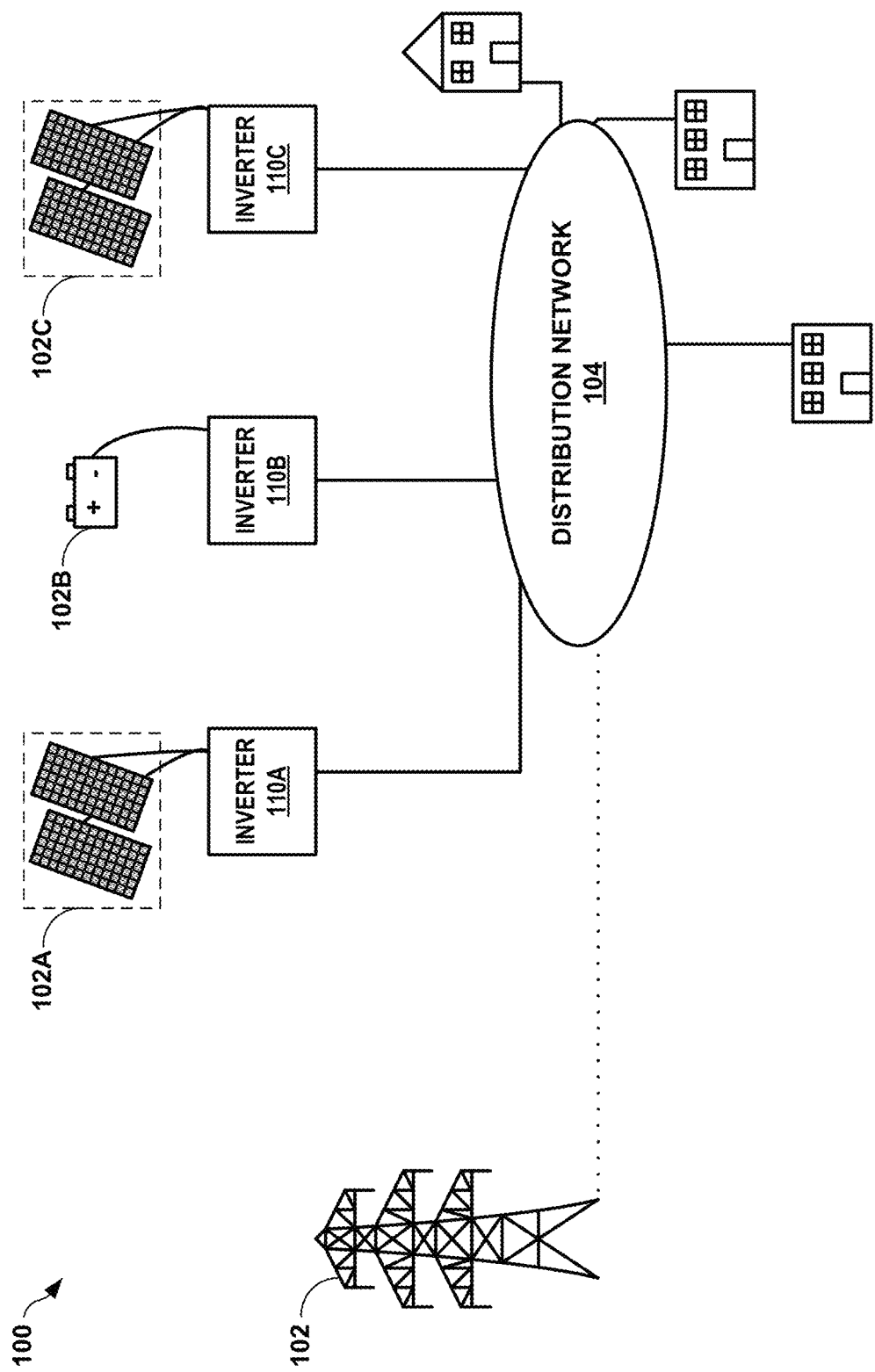
FIG. 1 is a conceptual diagram illustrating one example of a microgrid system (system 100) using VOC, in accordance with one or more aspects of the present disclosure.

FIG. 1 is a conceptual diagram illustrating one example of a microgrid system (system 100) using VOC, in accordance with one or more aspects of the present disclosure. FIG. 1 represents only one example of a system configured to use VOC, and various other systems and devices may be configured to use VOC in accordance with the techniques described herein.

Microgrids often include a collection of heterogeneous energy sources (e.g., photovoltaic arrays, fuel cells, and energy-storage devices). Microgrid 100, for instance, includes energy sources 102A-102C (collectively "energy sources 102"). Energy sources may be interfaced to an AC electric distribution network, such as distribution network 104.

Distribution network 104 is connected to bulk AC electrical system 106. For instance, bulk AC electrical system 106 may represent the "grid," generally. In some examples, network 104 may be "islanded" and operated independently from the bulk AC system. This is shown in the example of FIG. 1 by the dotted line between distribution network 104 and bulk AC electrical system 106.

In microgrids and other electrical networks, energy conversion is often performed by power-electronic inverters. In the example of FIG. 1, for instance, energy from energy sources 102 is converted by inverters 110A-110C (collectively "inverters 110"), respectively.

In islanded settings, the control challenge is to regulate the amplitude and frequency of the inverters' terminal voltage such that high power quality can be guaranteed to the loads in the network. The related-art control strategy of droop control is relatively ubiquitous in this domain. Droop control linearly trades off the inverter-voltage amplitude and frequency with real- and reactive-power output.

The techniques of the present disclosure, however, depart from droop control to pioneer time-domain control methods. In particular, the present disclosure provides a nonlinear control strategy where inverters 110 are controlled to emulate the dynamics of weakly nonlinear limit-cycle oscillators. This strategy is termed "virtual oscillator control" or "VOC" herein, since such nonlinear oscillators may be virtual (e.g., programmed on a digital controller) instead of physical.

VOC presents appealing circuit- (e.g., inverter) and system- (e.g., microgrid electrical network) level advantages. From a system-level perspective, synchronization emerges in connected electrical networks of inverters with VOC without any communication, and primary-level voltage- and frequency-regulation objectives are ensured in a decentralized fashion. At the circuit level, each of inverters 110 is able to rapidly stabilize arbitrary initial conditions and load transients to a stable limit cycle. As such, VOC is fundamentally different than droop control. While VOC acts on instantaneous time-domain signals, droop control is based on phasor electrical quantities and the notion of an electrical frequency that are only well defined on slow AC-cycle time scales. As further described herein, however, the sinusoidal state behavior of VOC can be engineered to correspond to droop laws as well.

AC performance requirements for inverters 110 (e.g., voltage and frequency regulation, harmonics, dynamic response, etc.) may typically be specified with the aid of phasor quantities that are only valid in the quasi-stationary sinusoidal steady state. As such, given the intractability of obtaining closed-form solutions to the oscillator dynamic trajectories, from the outset it may be unclear how to design the nonlinear oscillators such that the controlled inverters meet prescribed specifications. The present disclosure provides one solution to the oscillator synthesis problem by using averaging- and perturbation-based nonlinear-systems analysis methods as detailed below. This process focuses on an averaged dynamical model for the nonlinear oscillators that couples the real- and reactive-power outputs to the terminal-voltage dynamics of an inverter. Analyzing this averaged model in the sinusoidal steady state uncovers the voltage- and frequency-regulation characteristics of virtual-oscillator-controlled inverters. In addition, the present disclosure provides perturbation-based methods that, in general, may allow for approximating solutions to periodic nonlinear dynamical systems when analytical closed-form solutions cannot be found. This analysis parameterizes the higher-order harmonic content in the inverter output as a function of the oscillator parameters, further aiding in oscillator design.

Figure 2:
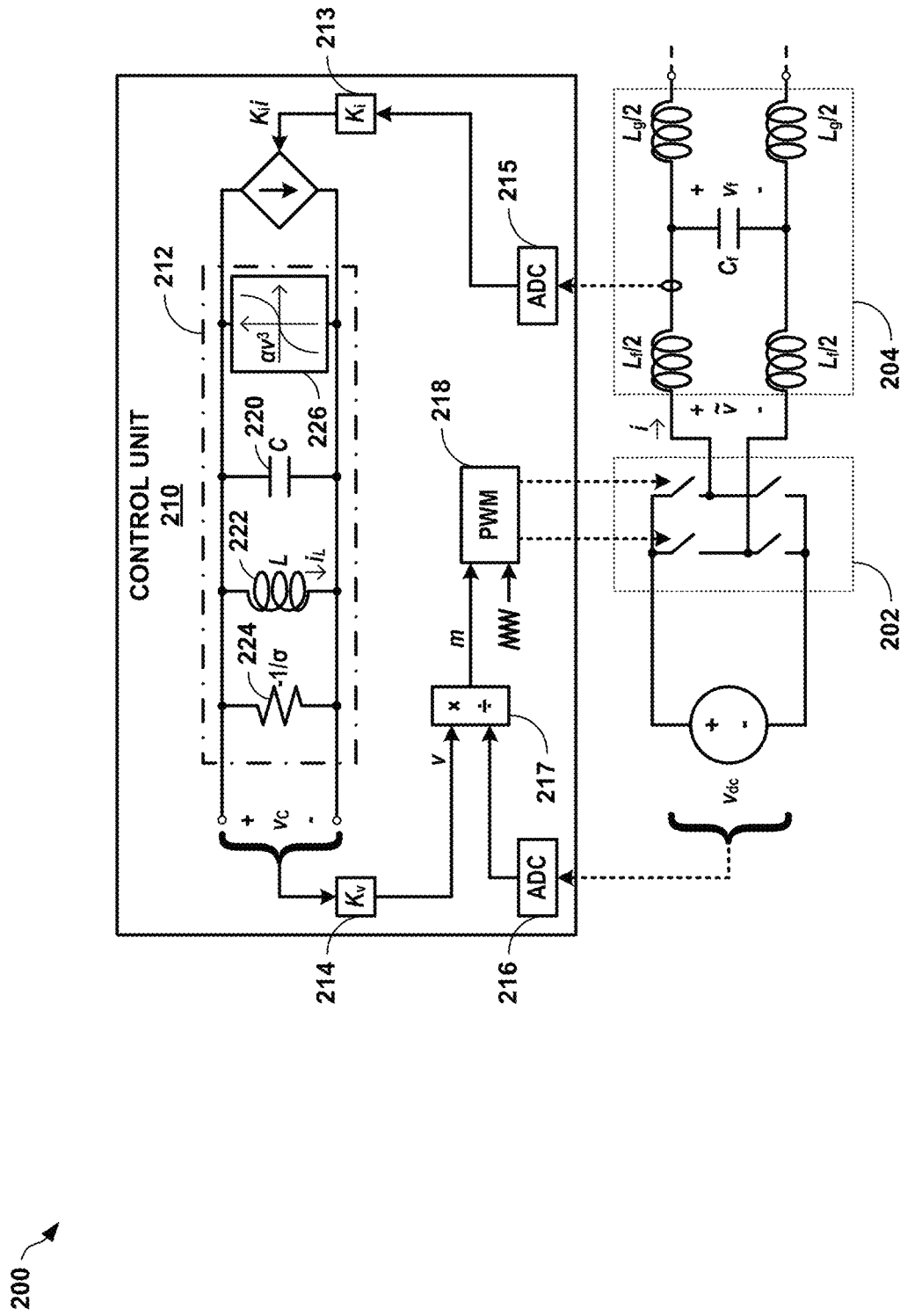
FIG. 2 is a circuit diagram illustrating one example of a single-phase power-electronic inverter implemented using VOC, in accordance with one or more aspects of the present disclosure.

FIG. 2 is a circuit diagram illustrating one example of a single-phase power-electronic inverter (e.g., inverter 200) implemented using VOC, in accordance with one or more aspects of the present disclosure. Specifically, FIG. 2 illustrates a Van der Pol VOC implementation for a single phase inverter, inverter 200 represents only one example of an inverter implemented using VOC, and various other structures and configurations may use one or more of the techniques described herein. For example, other devices may include additional or alternative components not shown in the example of FIG. 2.

In the example of FIG. 2, inverter 200 includes power electronics switches 202. Switches 202 implement a single-phase H-bridge. As such, alternative sets of switches 202 may be opened and closed in sequence to convert a DC signal (shown as $v_{dc}$ in FIG. 2) into an AC signal. As shown in FIG. 2, the opening and closing of power electronics switches 202 is controlled by signals received from control unit 210, described below.

Inverter 200, in the example of FIG. 2, also includes LCL output filter 204. LCL output filter 204 may reduce high-order harmonics in the inverter terminal voltage. LCL output filter 204 includes inverter-side inductors (shown as $L_f$ in FIG. 2), an AC filter capacitor (shown as $C_f$ in FIG. 2), and grid-side inductors (shown as $L_g$ in FIG. 2).

In the example of FIG. 2, inverter 200 also includes control unit 210. Control unit 210 may be a processor, such as a microcontroller, a digital signal processor (DSP), a field-programmable gate array (FPGA) or other suitable device configured to implement the various modules described herein. Control unit 210 implements a discrete realization of the nonlinear dynamics of a Van der Pol oscillator (e.g., virtual oscillator 212).

Virtual oscillator 212, in the example of FIG. 2, is composed of the parallel connection of virtual capacitor 220, virtual inductor 222, virtual negative-conductance element 224 and virtual cubic voltage-dependent current source 226. Virtual capacitor 220 and virtual inductor 222 represent a harmonic oscillator with inductance, L, and capacitance, C, yielding a resonant frequency, $\omega^* = 1/\sqrt{LC}$). Virtual negative-conductance element 224 may have a conductance value of $-\sigma$. A voltage across virtual capacitor 220 is denoted by $v_C$ and a current through virtual inductor 222 is denoted by $i_L$. A current consumed by virtual cubic voltage-dependent current source 226 is given by $\alpha v_C^3$, where $\alpha$ is a positive constant.

In the example of FIG. 2, virtual oscillator 212 is coupled to physical electrical signals in inverter 200 through current-scaling unit 213 and voltage-scaling unit 214 (using scaling factor values $\kappa_i$ and $\kappa_v$, respectively). Specifically, an output current of inverter 200, i, may be processed by analog-to-digital converter (ADC) 215 and provided to current-scaling unit 213. Current-scaling unit 213 may multiply the received signal by $\kappa_i$. The resulting scaled current may then be extracted from virtual oscillator circuit 212. The resulting value of $v_C$ (the voltage across virtual capacitor 220) is provided to voltage-scaling unit 214. Voltage-scaling unit 214 may multiply the received signal by $\kappa_v$ to produce the signal $v$.

Virtual oscillator 212, in the example of FIG. 2, also includes ADC 216 and modulation unit 217. ADC 216 converts the DC bus voltage $V_{dc}$ to a digital value, which is provided to modulation unit 217. Modulation unit 217 receives the digitized DC bus voltage and the signal $v$ from voltage-scaling unit 214 and divides the latter by the former. That is, modulation unit 217 divides $v$ by $V_{dc}$ to produce a modulation signal m.

For the single-phase inverter topology depicted in FIG. 2, the PWM signal, m(t), may be constructed as follows $$m(t) = \frac{v(t)}{v_{dc}}, \quad (1)$$

where $v_{dc}$ is the DC-bus voltage.

In the example of FIG. 2, virtual oscillator 212 includes pulse width modulation (PWM) unit 218. PWM receives the modulation signal m and compares its instantaneous value to a carrier waveform to generate the control signals for power-electronics switches 202. If the modulation signal value is higher than the carrier waveform value, one set of power-electronics switches 202 will be "on" and the others will be "off." If the modulation falls below the carrier, another set of switches turns "on" and the first turns "off." In the example of FIG. 2, the switching frequency may be equal to the carrier frequency.

The carrier waveform, in the example of FIG. 2, is a free-running triangular waveform. In practice, the carrier waveform may be generated by a digital counter (not shown) that counts up and/or down between a minimum and maximum value to create the triangular waveform, or by a suitable analog signal generator. The modulation signal (which, for example, may look like a sinusoid in steady-state), is typically scaled such that its max and min lie within the max and min of the carrier waveform. Since the carrier has a much higher frequency (e.g., tens of kHz) than the modulation signal (e.g., 60 Hz), there will be many transition points where the carrier will rise above and fall below the modulation signal.

The switching period, $T_{sw}$, is much smaller than the period of the modulation signal, which in this setting is approximately $2\pi/\omega^*$, where $\omega^*$ is the resonant frequency of the LC harmonic oscillator. Consequently, the switch-cycle average of the instantaneous inverter-terminal voltage—denoted by $\tilde{v}$ in FIG. 2—is approximately equal to the scaled virtual capacitor voltage, $v$:

$$\frac{1}{T_{sw}} \int_{s=t-T_{sw}}^{t} v(s)ds = m(t)v_{dc} = v(t). \tag{2}$$

It is assumed hereafter that the switch-cycle-average inverter terminal voltage is equal to $v$ and this is referred to as the inverter terminal voltage.

The following is an analysis of the terminal-voltage dynamics of the VO-controlled inverter 200 as shown in FIG. 2. The resulting dynamic model may then be leveraged to synthesize the underlying virtual oscillator such that inverter 200 meets AC performance specifications. The description herein is focused on real- and reactive-power ratings, voltage limits, output-current ratings, maximum frequency deviation, dynamic response, and higher-order harmonics. These performance specifications are connected below to the inherently nonlinear dynamics of the Van der Pol oscillator. In other examples, additional and/or other performance specifications may also be utilized.

To begin, the voltage- and frequency-regulation characteristics of a VO-controlled inverter (e.g., inverter 200 of FIG. 2) may be derived. The derivation is based on an averaging analysis of the Van der Pol oscillator dynamics.

The dynamics of the virtual-oscillator inductor current, $i_L$, and inverter terminal voltage, $v$, are given by $$L\frac{di_L}{dt} = \frac{v}{\kappa_v}, \tag{3}$$

$$C\frac{dv}{dt} = -\alpha\frac{v^3}{\kappa_v^2} + \sigma v - \kappa_v i_L - \kappa_v \kappa_i i.$$

The inverter terminal voltage is parameterized in one of the two forms below $$v(t) = \sqrt{2}V(t)\cos(\omega t + \theta(t)) = \sqrt{2}V(t)\cos(\phi(t)), \tag{4}$$

where $\omega$ is the electrical frequency, $\theta(t)$ represents the phase offset with respect to $\omega$, and $\phi(t)$ is the instantaneous phase angle. In order to completely specify the terminal voltage at any instant, it is necessary to obtain the dynamical equations that govern the evolution of the RMS-voltage, V(t), and phase offset, $\theta(t)$, (or equivalently, the instantaneous phase angle, $\phi(t)$). To this end, the following definitions will help simplify notation:

$$\varepsilon := \sqrt{\frac{L}{C}}, \; g(y) := y - \frac{\beta}{3}y^3, \; \beta := \frac{3\alpha}{\kappa_v^2 \sigma}. \tag{5}$$

A state-space model of the VO-controlled inverter in Cartesian coordinates aimed at recovering the RMS-voltage amplitude and instantaneous phase dynamics can be formulated with a scaled version of the inductor current and the inverter terminal voltage selected as states, $x:=\kappa_v \varepsilon i_L$, and $y:=v$. With the aid of the $g(\cdot)$ and $\varepsilon$ defined in (5), (3) may be rewritten in the time coordinates $\tau=\omega^* t=(1/\sqrt{LC})t$ as follows:

$$\dot{x} = \frac{dx}{d\tau} = y, \tag{6}$$

$$\dot{y} = \frac{dy}{d\tau} = -x + \varepsilon\sigma g(y) - \varepsilon\kappa_v\kappa_i i. \tag{7}$$

Next, with the coordinate transformation $$\sqrt{2}V = \sqrt{x^2 + y^2}, \; \phi = \tan^{-1}\left(\frac{x}{y}\right), \tag{8}$$

applied to (6)-(7), the following dynamical model for the RMS terminal-voltage amplitude, V, and the instantaneous phase angle, $\phi$, are recovered:

$$\dot{V} = \frac{dV}{d\tau} = \frac{\varepsilon}{\sqrt{2}}\left(\sigma g(\sqrt{2}V\cos(\phi)) - \kappa_v\kappa_i i\right)\cos(\phi), \tag{9}$$

$$\dot{\phi} = \frac{d\phi}{d\tau} = 1 - \frac{\varepsilon}{\sqrt{2}V}\left(\sigma g(\sqrt{2}V\cos(\phi)) - \kappa_v\kappa_i i\right)\sin(\phi).$$

As $\varepsilon \searrow 0$, the so-called quasi-harmonic limit is transitioned, where the (unloaded) oscillator exhibits near-sinusoidal oscillations at the resonant frequency of the LC harmonic oscillator:

$$\omega^* = \frac{1}{\sqrt{LC}}. \tag{10}$$

A demonstration of $\varepsilon$ as a design parameter that has bearing on the dynamic response and the harmonics of the system can be found below with respect to design procedure. In particular, a small value of $\varepsilon$ may ensure near-sinusoidal oscillations, potentially at the expense of a sluggish dynamic response.

By focusing on the parametric regime characterized by $\varepsilon \searrow 0$, notations of periodic averaging may be leveraged to further simplify and analyze the weakly nonlinear periodic dynamics in (9). As a primer, consider a time-varying dynamical system $\dot{x}=\varepsilon f(x,\tau,\varepsilon)$, with time-periodic vector field $$f(x,\tau,\varepsilon)=f(x,\tau+T,\varepsilon), \tag{11}$$

with period T>0 and a small parameter $\varepsilon$>0. The associated time-averaged dynamical system may be defined as $$\dot{\bar{x}} = \varepsilon f_{avg}(\bar{x}) = \frac{\varepsilon}{T}\int_{\tau=0}^{T} f(\bar{x}, \tau, 0)d\tau. \tag{12}$$

The averaged system, $f_{avg}(\bar{x})$, is autonomous and in general, more amenable to analysis compared to the original non-averaged system $f(x,\tau,\varepsilon)$. Furthermore, for $\varepsilon \searrow 0$, the accuracy is not compromised by analyzing the averaged system, since it follows that the difference in the state variables corresponding to the original and averaged systems is of $\mathcal{O}(\varepsilon)$. In particular, $$x(\tau,\varepsilon) - \bar{x}(\varepsilon\tau) = \mathcal{O}(\varepsilon). \tag{13}$$

Subsequently, the time average of a periodic signal x(t) with period T>0 is denoted by $\bar{x}$ and defined as follows:

$$\bar{x} := \frac{1}{T} \int_{s=0}^{T} x(s) ds. \tag{14}$$

With these preliminaries in place, the dynamics in (9) averaged over one AC cycle, $2\pi/\omega^*$, under the implicit assumption that $\epsilon = \sqrt{L/C} \searrow 0$ are given by the following set of coupled nonlinear differential equations:

$$\frac{d}{dt}\bar{V} = \frac{\sigma}{2C}\left(\bar{V} - \frac{\beta}{2}\bar{V}^3\right) - \frac{\kappa_v \kappa_i}{2C\bar{V}}\bar{P}, \tag{15}$$

$$\frac{d}{dt}\bar{\theta} = \omega^* - \omega + \frac{\kappa_v \kappa_i}{2C\bar{V}^2}\bar{Q}, \tag{16}$$

where $\bar{P}$ and $\bar{Q}$ are the average real- and reactive-power outputs of the VO-controlled inverter (measured with respect to the nominal frequency, $\omega^*$), respectively.

Using this nonlinear control strategy, close to the sinusoidal steady state (recovered in the quasi-harmonic limit $\epsilon \searrow 0$), the voltage-amplitude and phase dynamics are directly linked to the average real- and reactive-power outputs of the inverter, respectively. Consequently, these averaged dynamics are leveraged herein for designing virtual oscillator controlled inverters that satisfy voltage- and frequency-regulation specifications in sinusoidal steady state. To this end, the equilibrium solutions corresponding to (15)-(16) are useful, as they establish the voltage- and frequency-regulation characteristics of the VO-controlled inverter.

For the voltage-regulation characteristic, the equilibria of (15) can be recovered from the solutions of the nonlinear equation:

$$0 = \frac{\sigma}{2C}\left(\bar{V}_{eq} - \frac{\beta}{2}\bar{V}_{eq}^3\right) - \frac{\kappa_v \kappa_i}{2C\bar{V}_{eq}}\bar{P}_{eq}, \tag{17}$$

where $\bar{V}_{eq}$ and $\bar{P}_{eq}$ represent the equilibrium steady-state RN/IS-voltage amplitude and average real-power output, respectively. Rearranging terms in (17) provides the following power-balance condition for the VO-controlled inverter:

$$\frac{\sigma\beta}{2}\bar{V}_{eq}^4 - \sigma\bar{V}_{eq}^2 + \kappa_v\kappa_i\bar{P}_{eq} = 0. \tag{18}$$

The positive roots of (18) are given by $$\bar{V}_{eq} = \kappa_v \left( \frac{\sigma \pm \sqrt{\sigma^2 - 6\alpha(\kappa_i/\kappa_v)\bar{P}_{eq}}}{3\alpha} \right)^{\frac{1}{2}}, \tag{19}$$

where the fact that $\sigma\beta = 3\alpha/\kappa_v^2$ was used (see (5)). Notice that (19) has two roots. Both roots are real valued if the equilibrium real-power output satisfies $$0 < \bar{P}_{eq} < \bar{P}_{cr} := \frac{\sigma^2}{6\alpha(\kappa_i/\kappa_v)}, \tag{20}$$

where $\bar{P}_{cr}$ is referred to as the critical value for real power. The corresponding critical value of the terminal voltage is given by $$\bar{V}_{cr} := \kappa_v \sqrt{\frac{\sigma}{3\alpha}}. \tag{21}$$

Under a set of mild power-flow decoupling approximations, the high-voltage solution in (19) is locally asymptotically stable. Hereinafter, the high-voltage solution of (19) is referred to with a slight abuse of notation as $\bar{V}_{eq}$. It is worth mentioning that the high-voltage root is a decreasing function of $\bar{P}_{eq}$ over the range $0 \leq \bar{P}_{eq} \leq \bar{P}_{cr}$. That is, steady-state voltage "droops" with increasing real power output. Finally, also note that the open-circuit voltage of the VO-controlled inverter, $\bar{V}_{oc}$, can be Obtained by substituting $\bar{P}_{eq}=0$ into the high-voltage root in (19):

$$\bar{V}_{oc} = \kappa_v \sqrt{\frac{2\sigma}{3\alpha}}. \tag{22}$$

For the frequency-regulation characteristic, consider the phasor-angle dynamics in (16). The equilibrium of (16) returns the frequency of the VO-controlled inverter:

$$\omega_{eq} = \omega^* + \frac{\kappa_v \kappa_i}{2C\bar{V}_{eq}^2}\bar{Q}_{eq}, \tag{23}$$

where $\bar{V}_{eq}$ is the stable high-voltage equilibrium obtained from (19), and $\bar{Q}_{eq}$ is the average reactive-power output of the VO-controlled inverter.

The next focus is the dynamic response of the VO-controlled inverter (e.g., inverter 200 shown in FIG. 2). Specifically of interest is how quickly the terminal voltage of an unloaded inverter builds up to the open-circuit voltage. The voltage dynamics of interest are recovered from (15) by setting $\bar{P}=0$:

$$\frac{d}{dt}\bar{V} = \frac{\sigma}{2C}\left(\bar{V} - \beta\frac{1}{2}\bar{V}^3\right). \tag{24}$$

Since (24) is a variable-separable ordinary differential equation, both sides can be integrated, setting the limits from 0.1 $\bar{V}_{oc}$ to 0.9$\bar{V}_{oc}$ (without loss of generality). The time taken for this excursion is defined as the rise time. It is denoted by $t_{rise}$, and given by the solution of:

$$t_{rise} = \frac{2}{\epsilon\sigma}\left[\log\bar{V} - \frac{1}{2}\log\left|1 - \frac{\beta}{2}\bar{V}^2\right|\right]\Big|_{0.1\bar{V}_{oc}}^{0.9\bar{V}_{oc}}.$$

Evaluating the limits above results in the recovery of $$t_{rise} \approx \frac{6}{\omega * \varepsilon \sigma}. \tag{25}$$

The approximation in (25) indicates that the rise time, $t_{rise}$, is inversely proportional to E. This aspect will be leveraged in the design procedure below, specifically with regard to the virtual oscillator capacitance, C.

The above analysis pertains to an unloaded inverter. For an inverter loaded to its rated real power rating with a resistive load, $R_{rated}$, the rise time is given by $$t_{rise} \approx \frac{6}{\omega * \varepsilon \sigma'},$$

where $$\sigma' = \left(\sigma - \frac{K_v K_i}{R_{rated}}\right).$$

The analysis on inverter design may additionally or alternatively be performed with this specification of rise time, if need be.

The following portion derives a closed-form analytical expression for the amplitude of the third harmonic of an unloaded VO-controlled inverter (e.g., inverter 200 of FIG. 2). In particular, the effect of the nonlinear forcing term in (3), as executed within control unit 204, on the low-order harmonic content of the AC output is investigated. This analysis provides parameter selection with the aim of bounding the ratio of the amplitude of the third harmonic to the fundamental. To this end, perturbation methods and the method of multiple scales are used. These methods seek approximate analytical solutions to nonlinear dynamical systems where exact solutions cannot be found.

Consider the non-averaged dynamics of the terminal-voltage magnitude in an unloaded VO-controlled inverter:

$$\ddot{v} - \varepsilon \sigma (1 - \beta v^2) \dot{v} + v = 0, \tag{26}$$

where $v$ and $\beta$ are defined in (5), and as before, while operating in the quasi-harmonic limit $\varepsilon \searrow 0$. This model follows from expressing (6) and (7) as a second-order system with the input current $i=0$. The objective is an approximate solution to (26) that can be expressed as:

$$v(\tau,\varepsilon) \approx v_0(\tau,\tilde{\tau}) + \varepsilon v_1(\tau,\tilde{\tau}). \tag{27}$$

The solution is written with respect to two time scales: the original time scale $\tau$, and a slower time scale, $\tilde{\tau} := \varepsilon \tau$. While higher-order time scales (e.g., $\varepsilon^2 \tau$, $\varepsilon^3 \tau$, etc.) can be analyzed in a similar fashion to obtain approximate solutions correct to higher-order terms, the analysis performed herein is: i) valid up to $\mathcal{O}(\varepsilon)$, ii) yields an approximate amplitude for the third harmonic, and iii) provides error terms of $\mathcal{O}(\varepsilon^2)$. Substituting (27) in (26), and retaining only $\mathcal{O}(\varepsilon)$ terms results in:

$$\left(\frac{\partial^2 v_0}{\partial \tau^2} + v_0\right) + \varepsilon \left(\frac{\partial^2 v_0}{\partial \tau^2} + v_1 + 2\frac{\partial^2 v_0}{\partial \tau \partial \tilde{\tau}} - \sigma(1-\beta v_0^2)\frac{\partial v_0}{\partial \tau}\right) = 0. \tag{28}$$

Note that (28) must hold for any small parameter $\varepsilon$. This can be ensured if:

$$\frac{\partial^2 v_0}{\partial \tau^2} + v_0 = 0, \tag{29}$$

$$\frac{\partial^2 v_1}{\partial \tau^2} + v_1 + 2\frac{\partial^2 v_0}{\partial \tau \partial \tilde{\tau}} - \sigma(1-\beta v_0^2)\frac{\partial v_0}{\partial \tau} = 0. \tag{30}$$

Since (29) represents the dynamics of a simple harmonic oscillator, the corresponding closed-form solution can be expressed as:

$$v_0(\tau,\tilde{\tau}) := a_0(\tilde{\tau})\cos(\tau+\rho_0(\tilde{\tau})), \tag{31}$$

where $a_0(\tilde{\tau})$ and $\rho_0(\tilde{\tau})$ are amplitude and phase terms that vary in the slow time scale specified by $\tilde{\tau}$. For notational convenience, define the orthogonal signal $v_0^{\perp}(\tau,\tilde{\tau})$ associated with $v_0(\tau,\tilde{\tau})$ in (31) as follows:

$$v_0^{\perp}(\tau,\tilde{\tau}) := a_0(\tilde{\tau})\sin(\tau+\rho_0(\tilde{\tau})). \tag{32}$$

Substituting for $v_0$ from (31) into (30):

$$\begin{aligned}
\frac{\partial v_1}{\partial \tau^2} + v_1 &= -2\frac{\partial^2 v_0}{\partial \tau \partial \tilde{\tau}} + \sigma(1-\beta v_0^2)\frac{\partial v_0}{\partial \tau} \\
&= 2\frac{\partial v_0^{\perp}}{\partial \tilde{\tau}} - \sigma v_0^{\perp} + \sigma \beta v_0^2 v_0^{\perp} \\
&= 2\frac{\partial a_0}{\partial \tilde{\tau}}\sin(\tau+\rho_0) + 2v_0\frac{\partial \rho_0}{\partial \tilde{\tau}} - \\
&\quad \sigma v_0^{\perp} + \sigma \beta a_0^3(\sin(\tau+\rho_0) - \sin^3(\tau+\rho_0)) \\
&= 2\frac{\partial a_0}{\partial \tilde{\tau}}\sin(\tau+\rho_0) + 2v_0\frac{\partial \rho_0}{\partial \tilde{\tau}} - \\
&\quad \sigma v_0^{\perp} + \frac{\sigma \beta}{4} a_0^3(\sin(3\tau+3\rho_0) + \sin(\tau+\rho_0)),
\end{aligned} \tag{33}$$

where, in the last line of (33), the trigonometric identity $\sin 3\theta = 3\sin\theta - 4\sin^3\theta$ was used. Grouping together the coefficients that multiply the $\sin(\tau+\rho_0)$ and $\cos(\tau+\rho_0)$ terms, the last line of (33) can be rewritten as follows:

$$\frac{\partial^2 v_1}{\partial \tau^2} + v_1 = \left(2\frac{\partial a_0}{\partial \tilde{\tau}} - \sigma a_0 + \frac{\sigma \beta}{4}a_0^3\right)\sin(\tau+\rho_0) + \\ \left(2a_0\frac{\partial \rho_0}{\partial \tilde{\tau}}\right)\cos(\tau+\rho_0) + \frac{\sigma \beta}{4}a_0^3\sin(3\tau+3\rho_0). \tag{34}$$

The coefficients that multiply the $\sin(\tau+\rho_0)$ and $\cos(\tau+\rho_0)$ terms have to be forced to zero to ensure that unbounded terms of the form $\tau \sin(\tau+\rho_0)$ and $\tau \cos(\tau+\rho_0)$ do not appear in the solution for $v_1$. Consequently, the following can be recovered:

$$2\frac{\partial a_0(\tilde{\tau})}{\partial \tilde{\tau}} - \sigma a_0(\tilde{\tau}) + \frac{\sigma \beta}{4}a_0(\tilde{\tau})^3 = 0, \tag{35}$$

$$2a_0(\tilde{\tau})\frac{\partial \rho_0(\tilde{\tau})}{\partial \tilde{\tau}} = 0. \tag{36}$$

Solving (36) with initial condition $a_0(0)$ results in the following expression for $a_0(\tilde{\tau})$:

$$a_0(\tilde{\tau}) = \left(\frac{\beta}{4} + e^{-\eta - \sigma \tilde{\tau}}\right)^{-\frac{1}{2}}, e^\eta = \frac{a_0^2(0)}{1 - \frac{\beta}{4}a_0^2(0)}. \tag{37}$$

It follows that the peak amplitude of the first harmonic in sinusoidal steady state is given by:

$$\lim_{\tilde{\tau}\to\infty} a_0(\tilde{\tau}) =: a_0 = \frac{2}{\sqrt{\beta}}. \qquad (38)$$

Note that the RMS value corresponding to the peak amplitude in (38) matches the expression for the open-circuit voltage in (22). From (37), it can also be inferred that $a_0(\tilde{\tau}) \neq 0$ if $a_0(0) \neq 0$. Therefore, it can be seen from (35) that $\rho_0(\tilde{\tau}) = \rho_0$. That is, $\rho_0$ is independent of $\tilde{\tau}$.

With these observations in place, the following equation that governs the evolution of $v_1(\tau,\tilde{\tau})$ can be recovered from (34)

$$\frac{\partial^2 v_1}{\partial \tau^2} + v_1 = \frac{2\sigma}{\sqrt{\beta}} \sin(3\tau + 3\rho_0). \qquad (39)$$

The particular solution to (39) is given by the general form:

$$v_1(\tau) = -\frac{\sigma}{4\sqrt{\beta}} \sin(3\tau + 3\rho_0). \qquad (40)$$

From (31), (38), (40), and (27), it can be seen that the ratio of the amplitude of the third harmonic to the fundamental, a quantity denoted herein by $\delta_{3:1}$, is given by $$\delta_{3:1} = \frac{\varepsilon\sigma}{8}. \qquad (41)$$

If initial conditions for $v_1$ are taken into account while solving (39), (41) is correct up to $\mathcal{O}(\epsilon)$. Moreover, the expression in (41) indicates that the undesirable third-order harmonic is directly proportional to $\epsilon$. This aspect is also leveraged in the design procedure below with respect to the virtual oscillator capacitance, C.

Figure 3:
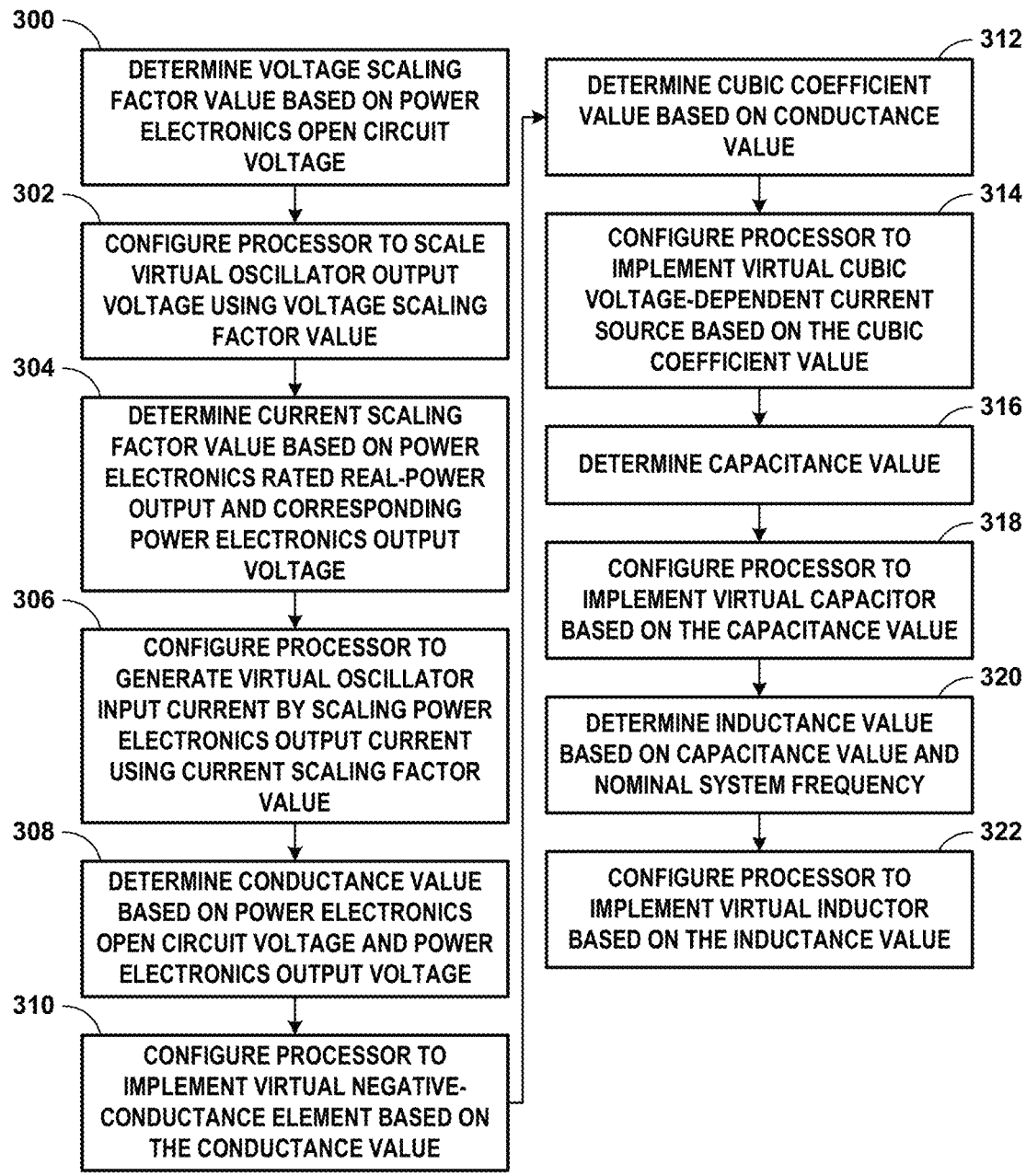
FIG. 3 is a flow diagram illustrating example operations for designing a VOC system, in accordance with one or more aspects of the present disclosure.

FIG. 3 is a flow diagram illustrating example operations for designing a VOC system, in accordance with one or more aspects of the present disclosure. More generally, FIG. 3 describes a systematic design strategy to synthesize nonlinear oscillators for inverter control. The design strategy shown in the example of FIG. 3 may aid in sculpting a desirable sinusoidal limit cycle that meets performance requirements specified in the lexicon of AC power systems. The disclosed strategy can be conveniently applied to design controllers for inverters with different power, voltage, and current ratings. In fact, for a system of parallel-connected inverters, the disclosed design strategy natively ensures power sharing in proportion to the inverter power ratings.

Tangentially related to the present disclosure are related-art efforts in the design of droop-controlled inverters. Particularly, there exists a wide body of literature that attempts to identify droop-control parameters that ensure inverters satisfy steady-state performance metrics and constraints such as voltage regulation, maximum frequency deviation, and proportional power sharing. Previous efforts in realizing VOC relied on an iterative design procedure involving simulation-based, open-circuit and full-rated-load tests to design the virtual oscillators. However, such ad-hoc design methods rely on repeated time-domain simulations to tune parameters and have not been affirmed by a rigorous non-linear-systems analysis approach. The unified and formal design methodology for VOC described herein may particularly benefit practicing engineers and others interested in specific implementation aspects.

The operations shown in FIG. 3 are described with reference to inverter 200 as shown in FIG. 2. FIG. 3 represents only one example method for determining Van der Pol oscillator parameter values such that a VO-controlled inverter (e.g., inverter 200 of FIG. 2) satisfies a set of AC performance specifications. In other examples, the design procedure may include additional or different operations. The virtual oscillator parameter values to be determined in the example of FIG. 3 are summarized in Table I below. The parameters include i) scaling factors $\kappa_v$ and $\kappa_i$, ii) voltage-regulation parameters $\sigma$ and $\alpha$, and iii) harmonic-oscillator parameters L and C.

TABLE I

VOC PARAMETERS

| Symbol | Description | Units |
|---|---|---|
| $\kappa_v$ | Voltage scaling factor | V/V |
| $\kappa_i$ | Current scaling factor | A/A |
| $\sigma$ | Conductance | $\Omega^{-1}$ |
| $\alpha$ | Cubic coefficient | A/V$^3$ |
| C | Harmonic-oscillator capacitance | F |
| L | Harmonic-oscillator inductance | H |

The performance specifications which the parameters are designed to satisfy include the open-circuit voltage $\overline{V}_{oc}$; rated real-power output and corresponding voltage $\overline{P}_{rated}$ and $\overline{V}_{min}$, respectively; rated reactive-power output $|\overline{Q}_{rated}|$; maximum-permissible frequency deviation, rise time, and ratio of the amplitude of the third harmonic to the fundamental $|\Delta\omega|_{max}$, $t_{rise}^{max}$, and $\delta_{3:1}^{max}$, respectively.

Solely for ease of understanding, a running example implementing the operations of FIG. 3 is included herein using the set of AC performance specifications shown in Table II below. These example specifications result in a voltage regulation of ±5% around a nominal voltage of 120 V, and frequency-regulation of ±0.5 Hz around a nominal frequency of 60 Hz. A hardware prototype implementing this example design is described below.

TABLE II

EXAMPLE AC PERFORMANCE SPECIFICATIONS

| Symbol | Description | Value | Units |
|---|---|---|---|
| $\overline{V}_{oc}$ | Open-circuit voltage | 126 | V (RMS) |
| $\overline{P}_{rated}$ | Rated real power | 750 | W |
| $\overline{V}_{min}$ | Voltage at rated power | 114 | V (RMS) |
| $|\overline{Q}_{rated}|$ | Rated reactive power | 750 | VARs |
| $\omega^*$ | Nominal system frequency | $2\pi 60$ | rad/s |
| $|\Delta\omega|_{max}$ | Maximum frequency offset | $2\pi 0.5$ | rad/s |
| $t_{rise}^{max}$ | Rise time (25) | 0.2 | s |
| $\delta_{3:1}^{max}$ | Ratio of third-to-first harmonic (41) | 2 | % |

Notice from FIG. 2 that the parameters $\kappa_v$ and $\kappa_i$, respectively, determine the voltage and current scaling between the physical inverter terminal voltage and output current, and those of virtual oscillator 212. To standardize design, $\kappa_v$ is chosen herein such that when the voltage of virtual capacitor 220 is 1 V RMS, the inverter-terminal voltage is equal to the open-circuit voltage $\overline{V}_{oc}$. Furthermore, $\kappa_i$ is chosen herein such that when the output of virtual oscillator 212 is 1 A, inverter 200 is loaded to full rated capacity $\overline{P}_{rated}$.

As a result, in the example of FIG. 3, a value of the voltage scaling factor, $\kappa_v$, may be determined based on the open-circuit voltage of the power electronics (operation 300). Specifically, $$\kappa_v := \overline{V}_{oc}. \tag{42a}$$

A processor implementing VOC as described herein may be configured to scale an output voltage of the virtual oscillator using the voltage scaling factor value (operation 302). For instance, voltage-scaling unit 214 of control unit 210 may be configured to scale $V_C$ using the voltage scaling factor value to generate $v$ as shown in FIG. 2.

In the example of FIG. 3, a value of the current scaling factor, $\kappa_i$, may be determined based on the rated real-power output and corresponding output voltage of the power electronics (operation 304). Specifically, $$\kappa_i := \frac{\overline{V}_{min}}{\overline{P}_{rated}}. \tag{42b}$$

The processor implementing VOC as described herein may be configured to generate a virtual oscillator input current by scaling the power electronics output current using the current scaling factor value (operation 306). For instance, current-scaling unit 213 of control unit 210 may be configured to scale i using the current scaling factor value to generate $\kappa_i i$ as shown in FIG. 2.

A system of inverters with different power ratings, connected in parallel, share the load power in proportion to their ratings if the current gains are chosen as suggested by (42). This directly follows as a consequence of (19) since $\kappa_i \overline{P}_{eq}$ is constant in the parallel configuration, and therefore, $\overline{P}_{eq}/\overline{P}_{rated}$ is the same for each inverter with identical voltage drops across each output impedance.

The example AC design specifications shown in Table II require an open-circuit voltage $\overline{V}_{oc}=126$ V. This translates to a voltage scaling factor value $\kappa_v=126$ V/V. A rated power and corresponding voltage $\overline{P}_{rated}=750$ W and $\overline{V}_{min}=114$ V results in a current scaling factor $\kappa_i=114/750=0.152$ A/A.

To determine a value of the VO conductance $\sigma$ and the cubic coefficient $\alpha$, the closed-form expression for the voltage-regulation characteristic in (19) may be used. Effectively, this design strategy will ensure that the equilibrium RMS terminal voltage of the inverter $\overline{V}_{eq}$ is bounded between the limits $\overline{V}_{oc} \geq \overline{V}_{eq} \geq \overline{V}_{min}$ as the average real-power output $\overline{P}_{eq}$ is varied between the limits $0 \leq \overline{P}_{eq} \leq \overline{P}_{rated}$.

First, notice from (22) that the choice of $\kappa_v$ in (42a) implies that $\alpha$ is related to $\sigma$ through $$\alpha = \frac{2\sigma}{3}. \tag{43}$$

Next, substituting $\overline{P}_{eq}=\overline{P}_{rated}$ and $\overline{V}_{eq}=\overline{V}_{min}$ into the high-voltage solution of (19) results in $$\overline{V}_{min} = \kappa_v \left( \frac{\sigma + \sqrt{\sigma^2 - 6\alpha(\kappa_i/\kappa_v)\overline{P}_{rated}}}{3\alpha} \right)^{\frac{1}{2}}. \tag{44}$$

Substituting $\kappa_v$ and $\kappa_i$ from (42) and for $\alpha$ from (43)

$$\overline{V}_{min} = \overline{V}_{oc} \left( \frac{\sigma + \sqrt{\sigma^2 - 4\sigma(\overline{V}_{min}/\overline{V}_{oc})}}{2\sigma} \right)^{\frac{1}{2}}. \tag{45}$$

Solving for $\sigma$ above results in $$\sigma = \frac{\overline{V}_{oc}}{\overline{V}_{min}} \frac{\overline{V}_{oc}^2}{\overline{V}_{oc}^2 - \overline{V}_{min}^2}. \tag{46}$$

Thus, in the example of FIG. 3, the conductance value $\sigma$ may be determined based on the open circuit voltage and the output voltage of the power electronics that corresponds to the rated real-power output (operation 308). The processor implementing VOC as described herein may be configured to implement a virtual negative conductance element based on the conductance value (operation 310). For example, Control unit 210 may be configured to implement virtual negative conductance element 224 of virtual oscillator 212 with a conductance of $1-/\sigma$.

Using (43) above, in the example of FIG. 3, the cubic coefficient value $\alpha$ may be determined based on the conductance value (operation 312). The processor implementing VOC as described herein may be configured to implement a cubic voltage-dependent current source based on the cubic coefficient value (operation 314). For example, control unit 210 may be configured to implement virtual cubic voltage-dependent current source 226 of virtual oscillator 212 to multiply the cubed voltage by $\alpha$.

The choice of $\alpha$ and $\sigma$ in (46), respectively, inherently establishes the critical power value $\overline{P}_{cr}$ in (20). The design may be iterated if the margin or difference between the rated and critical power values is insufficient.

Using the example AC design specifications shown in Table II (e.g., the RMS open-circuit and rated-voltage values $\overline{V}_{oc}=126$ V and $\overline{V}_{min}=114$ V) and applying (46) results in $\sigma=6.09$ $\Omega^{-1}$. From (43), $\alpha=4.06$ A/V$^3$.

Figure 4:
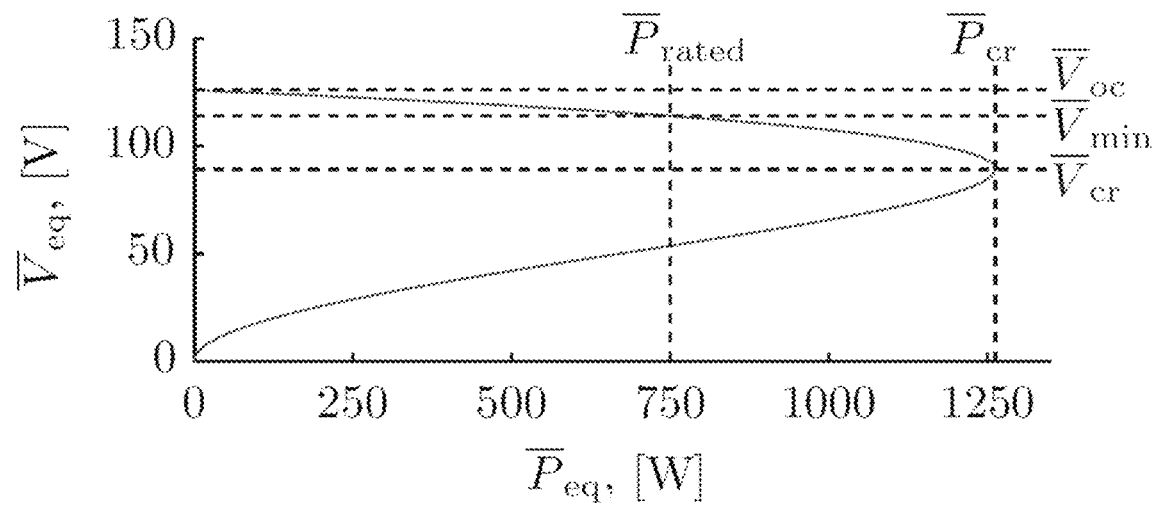
FIG. 4 is a graphical plot illustrating an example voltage-regulation curve resulting from example design specifications and voltage-regulation parameters determined therefrom, in accordance with one or more aspects of the present disclosure.

FIG. 4 is a graphical plot illustrating an example voltage-regulation curve resulting from the example design specifications of Table II and the voltage-regulation parameters determined therefrom, in accordance with one or more aspects of the present disclosure. Specifically, FIG. 4 shows the equilibrium terminal voltage $\overline{V}_{eq}$ as a function of the real-power output $\overline{P}_{eq}$. The inverter is designed to operate in the voltage regime $\overline{V}_{oc} \geq \overline{V}_{eq} \geq \overline{V}_{min}$.

Continuing the design process illustrated in FIG. 3, expressions for i) the frequency-regulation characteristic (23), ii) the rise time (25), and iii) the ratio of amplitudes of the third harmonic to the fundamental (41) may be leveraged to obtain a set of design constraints for the harmonic-oscillator parameter values (e.g., the capacitance C and inductance L).

In the example of FIG. 3, the capacitance value may be determined (operation 316) For instance, the capacitance value for an inverter may be determined based on (i) a specified rated reactive-power output value for the power electronics, (ii) a specified maximum frequency offset value, (iii) the specified rated real-power output value for the power electronics, (iv) the specified open-circuit voltage value for the power electronics, (v) the specified rated-real-power voltage value for the power electronics, (vi) a specified rise time value, (vii) a specified nominal system frequency value, and (viii) a specified ratio of an amplitude of a third harmonic to an amplitude of a fundamental. Begin with the equilibrium frequency analysis detailed above and the frequency-regulation characteristic in (23). The maximum permissible frequency deviation, denoted by $|\Delta\omega|_{max}$, is a design input. Substituting for $\kappa_v$ and $\kappa_i$ from (42) into (23), and considering the worst-case operating condition for the terminal voltage (which corresponds to consuming or sourcing the maximum reactive power at the minimum permissible terminal voltage, $\overline{V}_{min}$, which is defined in (45)) results in the following lower bound on the capacitance C:

$$C \geq \frac{1}{2|\Delta\omega|_{max}} \frac{\overline{V}_{oc}}{\overline{V}_{min}} \frac{|\overline{Q}_{rated}|}{\overline{P}_{rated}} =: C_{|\Delta\omega|_{max}}^{min} \quad (47)$$

where $\overline{Q}_{rated}$ is the maximum average reactive power that can be sourced or consumed by the VO-controlled inverter.

Next, consider the analysis of the (open-circuit) voltage amplitude dynamics detailed above, and the expression for the rise time in (25). With the maximum permissible rise time $t_{rise}^{max}$, serving as design input, the following upper bound for the capacitance C comes from (25) and (46):

$$C \leq \frac{t_{rise}^{max}}{6} \frac{\overline{V}_{oc}}{\overline{V}_{min}} \frac{\overline{V}_{oc}^2}{\overline{V}_{oc}^2 - \overline{V}_{min}^2} =: C_{t_{rise}}^{max}. \quad (48)$$

Finally, consider the harmonics analysis detailed above, and the expression for the ratio of the amplitudes of the third harmonic to the fundamental in (41). With the maximum permissible ratio $\delta_{3:1}^{max}$, serving as a design input, an additional lower bound on the capacitance C results from (41) and (46)

$$C \geq \left(\frac{1}{8\omega * \delta_{3:1}^{max}}\right) \frac{\overline{V}_{oc}}{\overline{V}_{min}} \frac{\overline{V}_{oc}^2}{\overline{V}_{oc}^2 - \overline{V}_{min}^2} =: C_{\delta_{3:1}}^{min}. \quad (49)$$

A capacitance value C may be determined that satisfies (47)-(49). The processor implementing VOC as described herein may be configured to implement a virtual capacitor based on the capacitance value (operation 318). For example, control unit 210 may be configured to implement virtual capacitor 220 of virtual oscillator 212 using the capacitance value.

In the example of FIG. 3, the inductance value L may be determined based on the capacitance value and a nominal system frequency (operation 320). That is, the inductance value may follow from rearranging terms in (10)

$$L = \frac{1}{C(\omega^*)^2}. \quad (50)$$

The processor implementing VOC as described herein may be configured to implement a virtual inductor based on the inductance value (operation 322). For example, control unit 210 may be configured to implement virtual inductor 222 of virtual oscillator 212 using the inductance value.

Combining (47)-(49) results in the following range in which C must be selected to meet the performance specifications of frequency regulation, rise time, and harmonics $$\max\{C_{|\Delta\omega|_{max}}^{min}, C_{\delta_{3:1}}^{min}\} \leq C \leq C_{t_{rise}}^{max}. \quad (51)$$

If $C_{t_{rise}}^{max} \leq \max\{C_{|\Delta\omega|_{max}}^{min}, C_{\delta_{3:1}}^{min}\}$, then it is not possible to simultaneously meet the specifications of frequency regulation, rise time, and harmonics. Therefore, (51) specifies a fundamental tradeoff in specifying performance requirements and designing VO-controlled inverters. In particular, a VO-controlled inverter that offers a short rise time will have a larger frequency offset and harmonic distortion, while a tightly regulated VO-controlled inverter (e.g., smaller frequency offset and harmonic distortion) will have a longer rise time.

The example AC design specifications of Table II include $|\Delta\omega|_{max} = 2\pi 0.5$ rad/s, $t_{rise}^{max} = 0.2$ s, and $\delta_{3:1}^{max} = 2\%$. Substituting these into (47)-(49) results in $C_{|\Delta\omega|_{max}}^{min} = 0.1759$ F, $C_{t_{rise}}^{max} = 0.2031$ F, and $C_{\delta_{3:1}}^{min} = 0.1010$ F. Therefore, to meet the performance specifications, a harmonic-oscillator capacitance C must be selected in the range 0.1759 F≤C≤0.2031 F. In this specific example, the rise time specification is prioritized and a value of C=0.1759 F is selected at the lower bound of the specified range. In various examples other AC design specifications may be prioritized. Since $\omega^* = 2\pi 60$ rad/s, it follows from (50) that L=39.99 µH.

Note that the voltage- and frequency-regulation specifications for the example discussed with respect to FIG. 3 are provided herein in terms of worst-case limits. Given the ubiquity of droop control in this domain, such specifications could be specified in terms of the active- and reactive-power droop coefficients $m_P$ and $m_Q$, respectively. Additionally, by leveraging the correspondences in (54) and (55), the design procedure shown in FIG. 3 may be modified to ensure that the VO-controlled inverter mimics a droop-controlled inverter with the specified $m_P$ and $m_Q$.

The example operations of FIG. 3 constitute a design procedure through which a VO-controlled inverter may be configured to meet a specified set of AC performance specifications. Such procedure may, in some examples, be performed by design engineers as part of a design process, or may be performed by one or more systems or machines, such as those used for fabrication.

As one example, a design system may be configured to receive, as input, AC design specifications for a particular device (e.g., an inverter). The design system may perform the operations described with respect to FIG. 3 above, and thereby configure a digital controller or other processor to emulate a virtual oscillator as described herein to control the corresponding device. In this way, the design procedure disclosed herein may facilitate more efficient production of multiple devices having different AC design specifications.

For resistive distribution lines, droop control linearly trades off the inverter terminal-voltage amplitude versus active power; and inverter frequency versus reactive power. In the context of the notation established above, these linear laws can be expressed as:

$$\overline{V}_{eq} = \overline{V}_{oc} + m_P \overline{P}_{eq}, \quad (52)$$

$$\omega_{eq} = \omega^* + m_P \overline{Q}_{eq}, \quad (53)$$

where $m_P < 0$ is the active-power droop coefficient and $m_Q > 0$ is the reactive-power droop coefficient.

It has been shown in the literature that the relations in (52) and (53) provide robust performance for various types of line impedances and are thus referred to as universal droop laws. The equilibria of the averaged VOC dynamics in (15) and (16) can be engineered to be in close correspondence with the droop laws in (52) and (53). For instance, a first-order expansion of $\overline{V}_{eq}$ (as a function of $\overline{P}_{eq}$) around the open-circuit voltage, $\overline{V}_{oc}$, is of the form (52) with the following choice of $m_P$:

$$m_P = \frac{\kappa_i \kappa_v}{2\sigma}(\overline{V}_{oc} - \beta \overline{V}_{oc}^3)^{-1}. \quad (54)$$

This expression can be derived by evaluating $d\overline{V}_{eq}/d\overline{P}_{eq}$ from (18) at the open-circuit voltage, $\overline{V}_{oc}$. Similarly, by inspecting (23), it can be seen that $\omega_{eq}$ as a function of $\overline{Q}_{eq}$ around the open-circuit voltage, $\overline{V}_{oc}$, is of the form (53) with the following choice of $m_Q$:

$$m_Q = \frac{\kappa_i \kappa_v}{2C\overline{V}_{oc}^2}. \quad (55)$$

With the design strategy described above with respect to FIGS. 3 and 4 for parameters C, $\kappa_v$, $\kappa_i$, $\alpha$, and $\sigma$, it emerges that the voltage-regulation characteristic in (19) and the frequency regulation characteristic in (2 are close to linear over a wide load range. Experimental results using a hardware prototype described below validate this claim, conclusively demonstrating that droop laws are embedded within the equilibria of the nonlinear VOC dynamics. In other words, the techniques described herein are backward compatible with existing droop control as the techniques described herein subsume droop control in sinusoidal steady state.

The converse scenario is also considered, wherein droop coefficients, $m_P$ and $m_Q$, are translated into VOC parameters. The choice of $\kappa_v$ and $\kappa_i$ (as given by (42)) and the choice of $\alpha$ (as given by (43)) would remain unchanged. With regard to $\sigma$, (54) and $\beta$ from (5) result in $$\sigma = -m_Q^{-1}\frac{\kappa_i}{2}. \quad (56)$$

Furthermore, from (55), it can be seen that the choice of capacitance, C would be given by $$C = m_Q^{-1}\frac{\kappa_i}{2\overline{V}_{oc}}, \quad (57)$$

while the inductance, L, would still be specified by (50). Limits on C can be considered in a similar fashion as before, if the specification on $m_Q$ is in terms of an upper bound.

Although correspondences between the quasi-steady-state behavior of the VOC techniques disclosed here and droop control exist as outlined above, their time-domain performance is markedly different. The main advantage of the techniques of the present disclosure is that they provide time-domain control which acts directly on unprocessed AC measurements when controlling the inverter terminal voltage, as evident in (3). This is unlike droop control which processes AC measurements to compute phasor-based quantities, namely real and reactive power, which are then used to update the inverter voltage amplitude and frequency setpoints. Since phasor quantities are not well-defined in real-time, droop control must necessarily employ a combination of low-pass filters, cycle averaging, coordinate transformations, or $\pi/2$ delays to compute $\overline{P}_{eq}$ and $\overline{Q}_{eq}$ in (52) and (53). These filters, which typically have a cutoff frequency in the range of 1 Hz to 15 Hz, act as a bottleneck to control responsiveness which in turn cause a sluggish response. In contrast, the VO-controlled inverters described herein may operate on real-time measurements and respond to disturbances as they occur. To illustrate these concepts, a simple case study is presented below that demonstrates the time-domain performance of VOC and its power-sharing capabilities.

Figure 5:
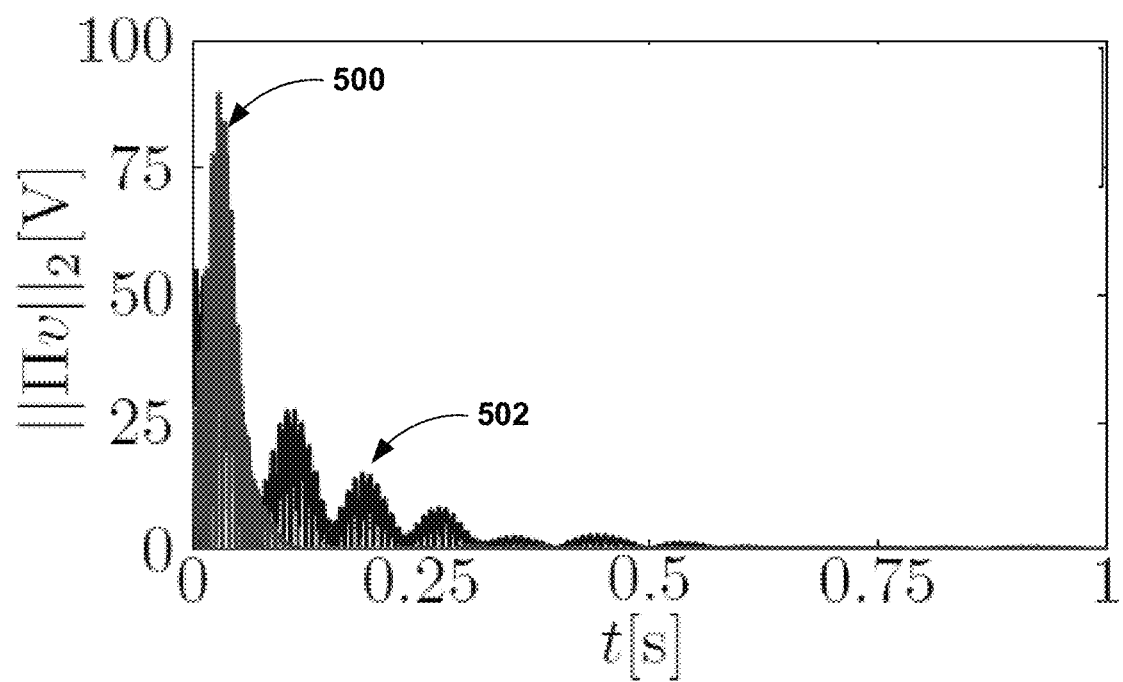
FIG. 5 is a graphical plot illustrating example synchronization times of droop control and virtual oscillator-based control, in accordance with one or more aspects of the present disclosure.
Figure 6A:
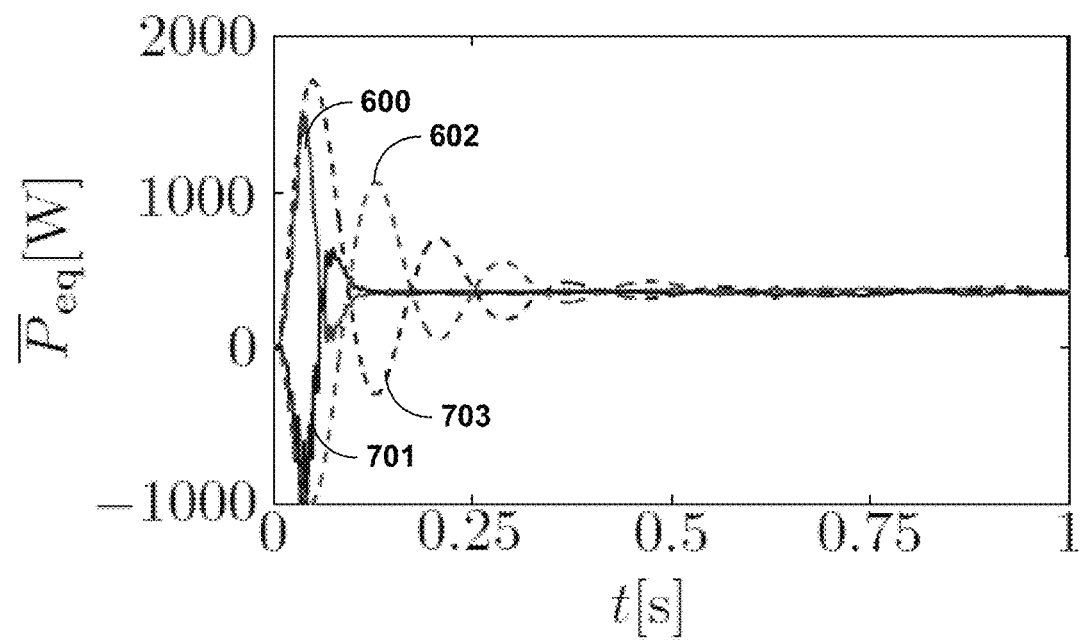
FIGS. 6A and 6B are graphical plots illustrating active- and reactive-power sharing among two inverters for virtual oscillator-based control and droop control, in accordance with one or more aspects of the present disclosure.
Figure 6B:
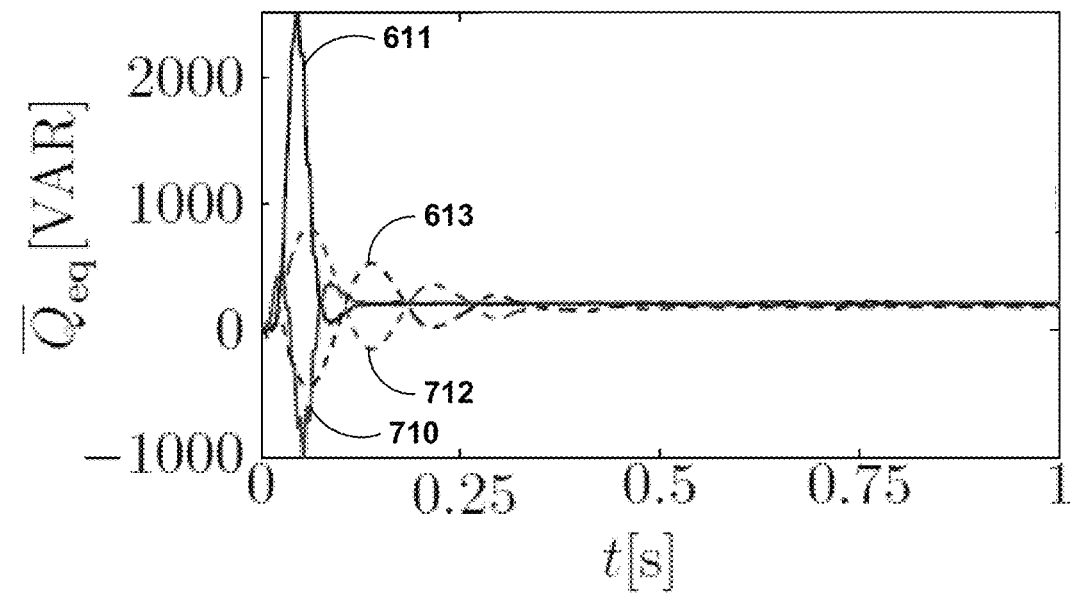

Consider two identical single-phase inverters connected in parallel through resistors to a parallel R-L load. The simulated time-domain behavior of VOC in such a scenario is shown in FIGS. 5, 6A, and 6B. Also shown, for comparison, is the performance of droop control. For the droop control implementation, the droop laws in resistive networks (52) and (53) are leveraged and the control architecture is adopted from the literature. The virtual oscillator that emulates the regulation characteristics is then derived by using the aforementioned analysis (equations (56) and (57)).

FIG. 5 is a graphical plot illustrating example synchronization times of droop control and virtual oscillator-based control, in accordance with one or more aspects of the present disclosure. More specifically, FIG. 5 depicts the time it takes for two inverters to synchronize starting from arbitrary initial conditions. Synchronization error, captured from the deviation of the inverter terminal voltages from the average, as a function of time, for VOC is shown by 500 and for droop control by 502. The waveforms shown in FIG. 5 may be obtained from switching-level simulations.

In the example of FIG. 5, a metric $\|\Pi\nu\|_2$ is used, where $\nu=[\nu_1,\nu_2]^T$ collects terminal voltages at the inverter. The matrix $\pi:=I_2-\frac{1}{2}1_2 1_2^T$ ($1_{2\times 2}$ is the 2×2 identity, and $1_{2\times 1}$ is the 2×1 vector with all entries equal to one) is the so-called projector matrix, and by construction, it can be seen that $\pi\nu$ returns a vector where the entries capture deviations from the average of the vector $\nu$. From FIG. 5, it can be seen that the inverters configured in accordance with the techniques described herein synchronize by around t=0.1 s, while with droop control, the inverters synchronize by t=0.6 s.

FIGS. 6A and 6B are graphical plots illustrating active- and reactive-power sharing among two inverters for virtual oscillator-based control and droop control, in accordance with one or more aspects of the present disclosure. In FIG. 6A, solid lines 600 and 601 represent the first and second VO controlled inverters, respectively and dotted lines 602 and 603 represent the first and second droop-controlled inverters, respectively. In FIG. 6B, solid lines 610 and 611 represent the first and second VO controlled inverters, respectively and dotted lines 612 and 613 represent the first and second droop-controlled inverters, respectively. FIGS. 6A and 6B show that identical active- and reactive-power sharing is achieved with both control strategies. It is worth noting, however, that VOC reaches steady-state faster than droop control. The R-L load considered in this particular setup has values of $R_{load}=20\Omega$ and $L_{load}=0.1$ H with interconnecting conductances $g_{1,line}=5$ $\Omega^{-1}$ and $g_{2,line}=4^{\Omega-1}$ respectively for Inverters 1 and 2.

A laboratory-scale hardware prototype using the virtual oscillator control techniques described herein with respect to FIGS. 2-6 was also created using the design specifications in Table II. The scaling, voltage-regulation, and harmonic-oscillator parameters (e.g., the parameters that completely characterize the virtual oscillator and ensure the VO-controlled inverter satisfies the design specifications) were computed in the running example discussed with respect to FIG. 3, above. For convenience, these values are listed in Table III below.

TABLE III

VOC PARAMETER VALUES

| Symbol | Description | Value | Units |
|---|---|---|---|
| $\kappa_v$ | Voltage scaling factor | 126 | V/V |
| $\kappa_i$ | Current scaling factor | 0.15 | A/A |
| $\sigma$ | Conductance | 6.09 | $\Omega^{-1}$ |
| $\alpha$ | Cubic coefficient | 4.06 | $A/V^3$ |
| C | Harmonic-oscillator capacitance | 0.18 | F |
| L | Harmonic-oscillator inductance | $3.99 \times 10^{-5}$ | H |

The component values of the inverter LCL filter for the prototype (e.g., corresponding to LCL output filter 204) were $L_f$=600 µH, $C_f$=24 µF, and $L_g$=44 µH, where $L_f$, $C_f$, and $L_g$ are the inverter-side inductor, AC-filter capacitor, and grid-side inductor, respectively. The switching frequency of the prototype inverter was $T_{sw}^{-1}$=15 kHz, the dead time was 200 ns, and the three-level unipolar sine-triangle PWM was utilized. In the specific example of the prototype, the non-linear dynamics of the virtual-oscillator circuit were programmed on a TMS320F28335 microcontroller available from Texas instruments headquartered in Dallas, Tex., USA.

To implement the virtual oscillator control on a digital control unit, the continuous functions may need to be discretized. To that end, denote the sampling time utilized in the numerical integration by $T_s$. In this particular implementation, $T_s^{-1}$=15 kHz is chosen. To discretize the virtual-oscillator dynamics (3), the trapezoidal rule of integration may be adopted and the following difference equations can be recovered:

$$v[k] = \left(1 - \frac{T_s\sigma}{2C} + \frac{T_s^2}{4LC}\right)^{-1}\left[\left(1 + \frac{T_s\sigma}{2C} - \frac{T_s^2}{4LC}\right)v[k-1] - \frac{T_s}{C}\kappa_v i_L[k-1] - \frac{T_s}{2C}\kappa_v\kappa_i(i[k] + i[k-1]) - \frac{\alpha T_s}{2C\kappa_v^2}(v^3[k] + v^3[k-1])\right], \quad (58)$$

$$i_L[k] = i_L[k-1] + \frac{T_s}{2L\kappa_v}(v[k] + v[k-1]).$$

where $k \in \mathbb{Z}_{\geq 0}$ denotes the kth sampling instance, i[k] is the sampled inverter-output current, $i_L$[k] is the sampled Van der Pol oscillator inductor current, and $v$[k] is the sampled inverter-terminal voltage. In some examples, the difference equations (58) may not be directly implemented on a digital controller, since they contain an algebraic loop through the cubic term $v^3$[k]. Therefore, it may be necessary to make a simplifying assumption to eliminate the algebraic loop. There are many approaches to accomplish this task. In the specific example of the prototype inverter described here, the assumption $v^3$[k]≈$v^3$[k−1] was made, allowing (58) to be approximated as:

$$v[k] = \left(1 - \frac{T_s\sigma}{2C} + \frac{T_s^2}{4LC}\right)^{-1}\left[\left(1 + \frac{T_s\sigma}{2C} - \frac{T_s^2}{4LC}\right)v[k-1] - \frac{T_s}{C}\kappa_v i_L[k-1] - \frac{T_s}{2C}\kappa_v\kappa_i(i[k] + i[k-1]) - \frac{\alpha T_s}{2C\kappa_v^2}v^3[k-1]\right], \quad (59)$$

$$i_L[k] = i_L[k-1] + \frac{T_s}{2L\kappa_v}(v[k] + v[k-1]).$$

The difference equations (59) yield reasonable (albeit approximate) dynamics of the virtual oscillator circuit (e.g., as shown in FIG. 2) and they can be implemented directly on a digital controller. The inverter PWM modulation signal (denoted m in the example of FIG. 2) can be constructed as:

$$m[k] := \frac{v[k]}{v_{dc}[k]}, \quad (60)$$

where $v_{dc}$[k] is the measured value of the inverter DC-bus voltage at the kth sampling instance.

Figures 7, 8:
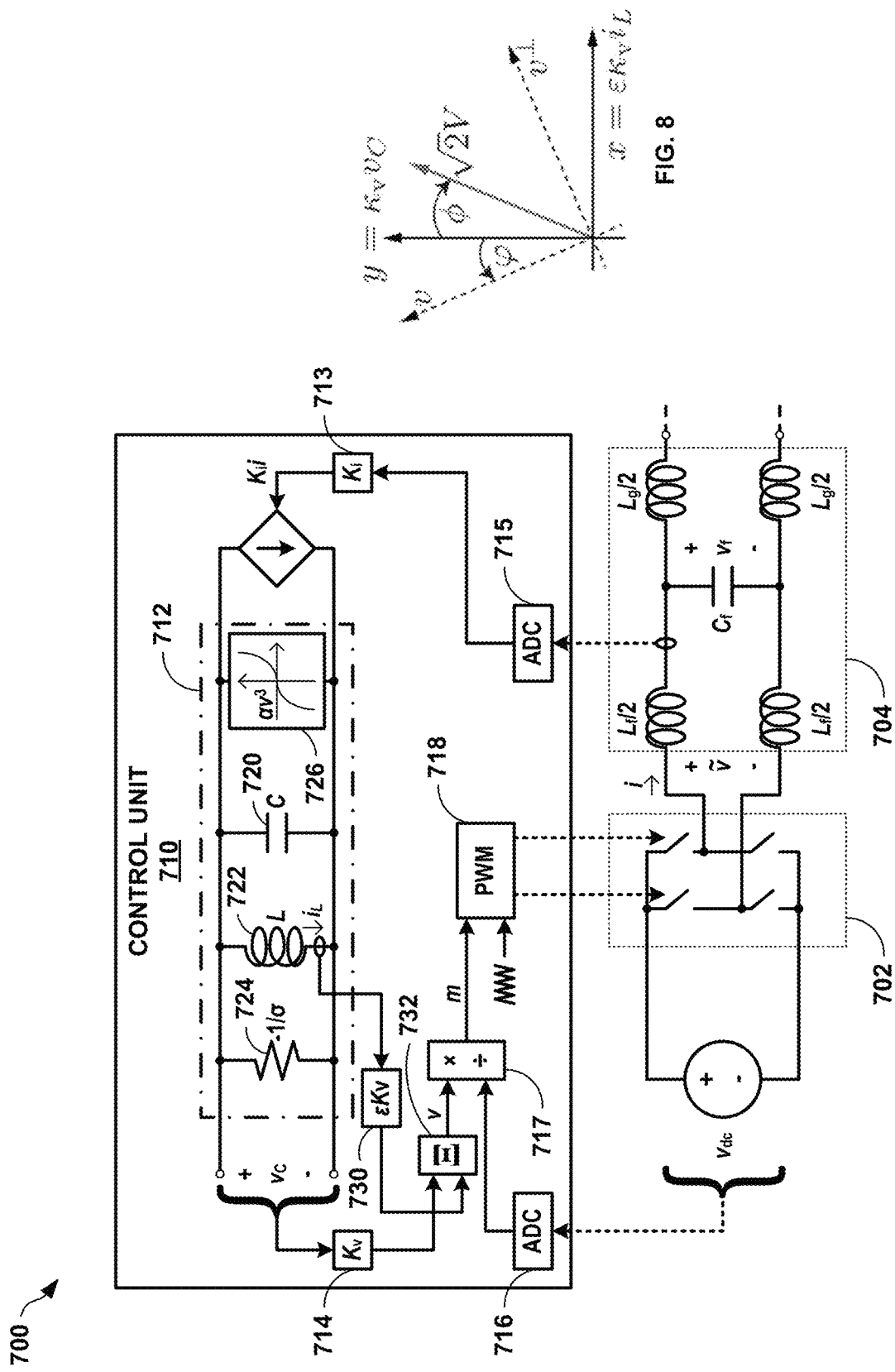
FIG. 7 is a circuit diagram illustrating another example of a single-phase power-electronic inverter implemented using VOC, in accordance with one or more aspects of the present disclosure.
FIG. 8 is a graphical plot illustrating VOC system dynamics on a polar plane, in accordance with one or more aspects of the present disclosure.

FIG. 7 is a circuit diagram illustrating another example of a single-phase power-electronic inverter (e.g., inverter 700) implemented using VOC, in accordance with one or more aspects of the present disclosure. Inverter 700 builds upon inverter 200, shown in the example of FIG. 2, and provides an extension that allows recovery of a family of droop relations (e.g., real power can be traded off for frequency and reactive power for voltage, as would be desired in inductive networks).

In the example of FIG. 7, inverter 700 includes power electronics switches 702, LCL output filter 704, and control unit 710. Control unit 710 is configured to implement virtual oscillator 712, current-scaling unit 713, voltage-scaling unit 714, ADCs 715 and 716, modulation unit 717, and PWM unit 718. Virtual oscillator 712 includes virtual capacitor 720, virtual inductor 722, virtual negative-conductance element 724, and virtual cubic voltage-dependent current source 726. In the example of FIG. 7, components 702, 704, 710, 712, 713, 714, 715, 716, 717, 718, 720, 722, 724, and 726 may have functionality similar to that of components 202, 204, 210, 212, 213, 214, 215, 216, 217, 218, 220, 222, 224, and 226 as shown FIG. 2, respectively.

In the example of FIG. 7, however, control unit 710 is further configured to implement current-scaling unit 730 and transformation unit 732. Current-scaling unit 730 scales the inductor current $i_L$ by $\epsilon\kappa_v$. Transformation unit 732 receives, as inputs, the voltage across virtual capacitor 720 and the current through virtual inductor 722, which have been scaled by $\kappa_v$ (by voltage-scaling unit 714) and $\epsilon\kappa_v$ (by current-scaling unit 730), respectively. Transformation unit 732 then performs an angular displacement of the virtual oscillator dynamic states and outputs $v$ for use in constructing the PWM switching signals for inverter 700. As the angular displacement is varied, the VOC dynamics in sinusoidal steady state vary from mimicking droop laws in resistive networks to those in inductive networks. That is, in essence, the coordinate transformation performed by transformation unit 732 allows for the recovery of a suite of nonlinear supersets to droop control.

The circuit equations that describe the operation of virtual oscillator 712 follow. Specifically, the dynamics of the current through virtual inductor 722, $i_L$, and the voltage across virtual capacitor 720, $v_C$, are:

$$L\frac{di_L}{dt} = v_c, \quad C\frac{dv_c}{dt} = -\alpha\frac{v_c^3}{\kappa_v^3} + \sigma v_c - i_L - \kappa_i i. \quad (61)$$

Note that (61) is essentially the same as (3) except that (61) makes reference to $v_C$ whereas (3) referenced $v/\kappa_v$. The definitions of (5) still hold to help simplify notation and thus the defined states x and y are the same as discussed with respect to FIG. 2:

In the example of FIG. 7, the system dynamics can now be represented on the polar plane as shown in FIG. 8, where $\sqrt{2}V=(x^2+y^2)^{1/2}$. The x and y coordinates are orthogonal and can be expressed as $$x(t)=\sqrt{2}V(t)\sin(\omega t+\theta(t))=\sqrt{2}V(t)\sin(\phi(\tau)),$$

$$y(t)=\sqrt{2}V(t)\cos(\omega t+\theta(t))=\sqrt{2}V(t)\cos(\phi(\tau)), \quad (62)$$

where $\omega$, $\theta(t)$, and $\phi(t)$ still represent the electrical frequency, the phase offset with respect to $\omega$, and the instantaneous phase angle, respectively.

With reference to FIG. 8, transformation unit 732 may perform a 2-D rotation to define another set of orthogonal signals, $vv(t)$ and $v^\perp(t)$, where $v(t)$ will subsequently be used to control the inverter terminal voltage. The values of $v$ and $v^\perp$ can be written in terms of the states=$\kappa_v v_C$ and y=$\kappa_v \epsilon i_L$ using the rotation matrix, $\Xi$, as:

$$\begin{bmatrix} v \\ v^\perp \end{bmatrix} = \begin{bmatrix} \cos\varphi & \sin\varphi \\ -\sin\varphi & \cos\varphi \end{bmatrix}\begin{bmatrix} y \\ x \end{bmatrix} =: \Xi \begin{bmatrix} y \\ x \end{bmatrix}. \quad (63)$$

In effect, the output voltage command is given by the first row of (63) and is now given by $v=\kappa_v v_C \cos\phi+\kappa_v \epsilon i_L \sin\phi$. In other words, the output voltage command is now a linear combination of the virtual oscillator capacitor voltage and inductor current.

To extract amplitude and phase information, the voltage signal, $v$, and its corresponding orthogonal signal, $v^\perp$, are transformed to polar coordinates as: $v=\sqrt{2}V \cos(\phi+\varphi)$, and $v^\perp=\sqrt{2}V \sin(\phi+\varphi)$. Differentiating the identities:

$$\sqrt{2}\,V = \sqrt{x^2+y^2} \text{ and } \phi = \tan^{-1}\frac{x}{y},$$

the following dynamical equations for V and $\varphi$ are obtained:

$$\dot{V} = \frac{\varepsilon}{\sqrt{2}}\left(\sigma g(\sqrt{2}\,V\cos(\phi)) - \kappa_v\kappa_i i\right)\cos(\phi), \quad (64)$$

$$\dot{\phi} = 1 - \frac{\varepsilon}{\sqrt{2}\,V}\left(\sigma g(\sqrt{2}\,V\cos(\phi)) - \kappa_v\kappa_i i\right)\sin(\phi).$$

Again, the parametric regime characterized by $\epsilon \searrow 0$ is focused on to ensure that dynamics mimic those of a harmonic oscillator. Furthermore, the dynamics in (64) are averaged to focus on AC-cycle time scales. The resulting autonomous system is far easier to analyze than the time-varying system (without compromising much on the accuracy as the analysis is still correct up to $\mathcal{O}(\epsilon)$). $\overline{V}$ and $\overline{\theta}$ are denoted to be $2\pi$-averaged values of V and $\theta$. Then, recognizing that $\epsilon \searrow 0$, the averaged dynamics can be written as:

$$\begin{bmatrix} \dot{\overline{V}} \\ \dot{\overline{\theta}} \end{bmatrix} = \frac{\varepsilon\sigma}{2}\begin{bmatrix} \overline{V}-\frac{\beta}{2}\overline{V}^3 \\ 0 \end{bmatrix} - \frac{\varepsilon\kappa_v - \kappa_i}{2\pi\sqrt{2}}\int_0^{2\pi} i\begin{bmatrix} \cos(\tau+\overline{\theta}) \\ -\frac{1}{\overline{V}}\sin(\tau+\overline{\theta}) \end{bmatrix}d\tau. \quad (65)$$

The relationship between terminal voltage and power is of interest. To that end, the instantaneous active- and reactive-power injections are defined as:

$$P(t) = v(t)i(t),\ Q(t) = v\left(t-\frac{\pi}{2}\right)i(t) =: v^\perp(t)i(t), \quad (66)$$

where i(t) is the output current. The average real and reactive power over an AC cycle of period $2\pi/\omega$ are:

$$\overline{P} = \frac{\omega}{2\pi}\int_{s=0}^{2\pi/\omega} P(s)ds,\ \overline{Q} = \frac{\omega}{2\pi}\int_{s=0}^{2\pi/\omega} Q(s)ds. \quad (67)$$

Transitioning (65) from $\tau$ to t coordinates, retaining only $\mathcal{O}(\epsilon)$ terms, and using the definitions of active and reactive power in (66) results in:

$$\frac{d}{dt}\overline{V} = \frac{\sigma}{2C}\left(\overline{V}-\frac{\beta}{2}\overline{V}^3\right) - \frac{\kappa_v\kappa_i}{2C}\left(\cos\phi\frac{\overline{P}}{\overline{V}}+\sin\phi\frac{\overline{P}}{\overline{V}}\right), \quad (68)$$

$$\frac{d}{dt}\overline{\theta} = \frac{\kappa_v\kappa_i}{2C}\left(-\sin\phi\frac{\overline{P}}{\overline{V}^2}+\cos\phi\frac{\overline{P}}{\overline{V}^2}\right)$$

Thus, the terminal-voltage amplitude and frequency dynamics that are linked to active- and reactive-power outputs at the inverter terminals through the 2-D rotation matrix, $\Xi$, are obtained. The steady-state voltage- and frequency-regulation equations are equilibrium points of the system in (68):

$$\sigma\overline{V}_{eq} - \frac{\sigma\beta}{2}\overline{V}_{eq}^3 - \kappa_v\kappa_i\begin{bmatrix} \cos\varphi \\ \sin\varphi \end{bmatrix}^T\begin{bmatrix} \frac{\overline{P}_{eq}}{\overline{V}_{eq}} \\ \frac{\overline{Q}_{eq}}{\overline{V}_{eq}} \end{bmatrix} = 0, \quad (69)$$

$$\omega_{eq} - \omega - \frac{\kappa_v\kappa_i}{2C}\begin{bmatrix} -\sin\varphi \\ \cos\varphi \end{bmatrix}^T\begin{bmatrix} \frac{\overline{P}_{eq}}{\overline{V}_{eq}^2} \\ \frac{\overline{Q}_{eq}}{\overline{V}_{eq}^2} \end{bmatrix} = 0,$$

with $\overline{V}_{eq}$, $\overline{P}_{eq}$, and $\overline{Q}_{eq}$ denoting RMS voltage amplitude, average real- and reactive-power output respectively, and $\omega_{eq}$ denoting the steady-state frequency. With appropriate decoupling assumptions, various droop-like laws can be recovered from (69): with $\varphi=\pi/2$, terminal voltage is traded off for reactive power and frequency is traded off for active power; similarly, with $\varphi=0$, the terminal voltage is traded off for active power and frequency is traded off for reactive power. These are reminiscent of the ubiquitous droop control laws for inductive (and resistive, respectively) line impedences.

Figure 9:
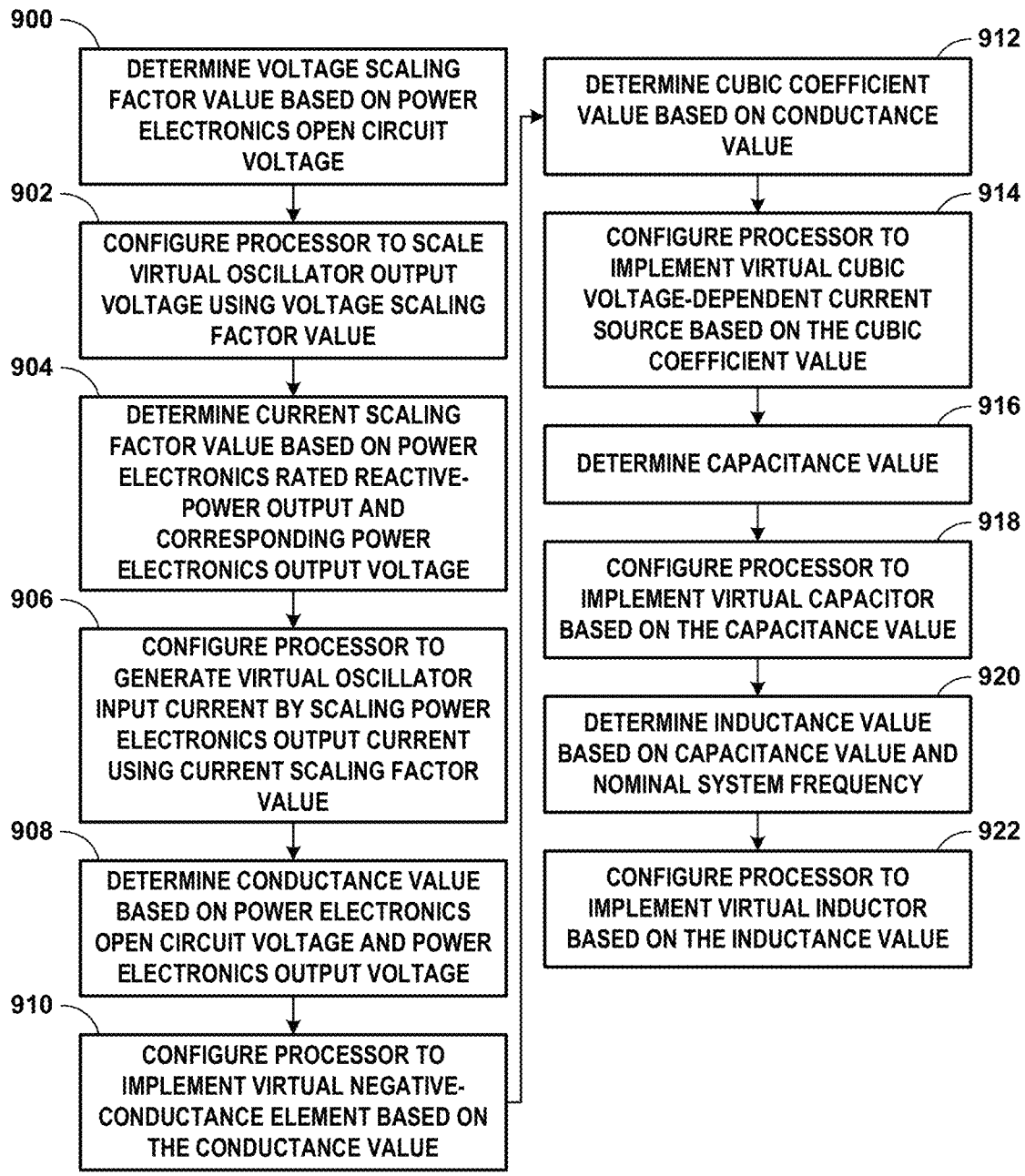
FIG. 9 is a flow diagram illustrating additional example operations for designing a VOC, system, in accordance with one or more aspects of the present disclosure.

FIG. 9 is a flow diagram illustrating additional example operations for designing a VOC system, in accordance with one or more aspects of the present disclosure. The operations shown in FIG. 9 are described with reference to inverter 700 as shown in FIG. 7. FIG. 9 represents only one example method for determining virtual oscillator parameter values such that a VO-controlled inverter (e.g., inverter 700 of FIG. 7) satisfies a set of AC performance specifications. In other examples, the design procedure may include additional or different operations.

The averaged models described with respect to FIG. 7 above reveal conclusive links between real- and reactive-power outputs and the terminal-voltage dynamics. Therefore, they suggest avenues to design the virtual oscillators so that the controlled inverter (e.g., inverter 700) satisfies performance requirements. With reference to the model in (69), the operations of FIG. 3 provide an example design procedure for the case where φ=0. The example operations of FIG. 9 explore an analogous design strategy for the case φ=π/2, which is applicable to inductive networks.

Accompanying the design strategy to pick system parameters is a running example for VOC design corresponding to the following set of AC performance specifications: rated real power 750 W, rated reactive power 750 VAR, voltage-regulation of ±5% around a nominal voltage of 120 V, frequency-regulation of ±0.5 Hz around a nominal frequency of 60 Hz, rise-time of 0.1 s, ratio of third-to-first harmonic 2% and load sharing in a parallel setting.

With the choice φ=π/2, the expressions in (69) boil down to the following:

$$\sigma \overline{V}_{eq} - \frac{\sigma \beta}{2} \overline{V}_{eq}^3 - \kappa_v \kappa_i \frac{\overline{Q}}{\overline{V}_{eq}} = 0, \tag{70}$$

$$\omega_{eq} - \omega + \frac{\kappa_v \kappa_i}{2C} \frac{\overline{P}}{\overline{V}_{eq}^2} = 0 \tag{71}$$

In the example of FIG. 9, a value of the voltage scaling factor, $\kappa_v$, may be determined based on the open-circuit voltage of the power electronics (operation 900). To standardize design, $\kappa_v$ is again chosen so that when the voltage across virtual capacitor 720 is 1 V RMS, the output voltage is the open-circuit voltage, $\overline{V}_{oc}$. A processor implementing VOC as described herein may be configured to scale an output voltage of the virtual oscillator using the voltage scaling factor value (operation 902).

A value of the current scaling factor, $\kappa_i$, may be determined based on the rated reactive-power output and corresponding output voltage of the power electronics (operation 904). In this example, $\kappa_i$ is chosen so that the output current is 1 A when rated reactive power, $\overline{Q}_{rated}$, is drawn from it. Thus, the choice of $\kappa_v$ and $\kappa_i$ are taken to be:

$$\kappa_v = \overline{V}_{oc}, \kappa_i = \frac{\overline{V}_{min}}{|\overline{Q}_{rated}|}. \tag{72}$$

The processor implementing VOC as described herein may be configured to generate a virtual oscillator input current by scaling the power electronics output current using the current scaling factor value (operation 906). For instance, current-scaling unit 713 of control unit 710 may be configured to scale i using the current scaling factor value to generate $\kappa_i$i as shown in FIG. 7.

For the specified voltage and current scaling factor values, σ can be calculated in terms of $\overline{V}_{min}$, which is the inverter terminal voltage when rated reactive power is drawn from it. Rearranging the terms and substituting values of $\kappa_v$ and $\kappa_i$ in voltage regulation equation gives $$\sigma = \frac{\overline{V}_{oc}^3}{\overline{V}_{min}(\overline{V}_{oc}^2 - \overline{V}_{min}^2)}. \tag{73}$$

Thus, in the example of FIG. 9, the conductance value σ may be determined based on the open circuit voltage and the output voltage of the power electronics that corresponds to the rated reactive-power output (operation 908). The processor implementing VOC as described herein may be configured to implement a virtual negative conductance element based on the conductance value (operation 910). For example, Control unit 710 may be configured to implement virtual negative conductance element 724 of virtual oscillator 712 with a conductance of −1/σ. In the running example described here, upon substituting $\overline{V}_{oc}$=120 V and $\overline{V}_{min}$=114 V, the result is σ=10.79.

Similar to operation 312 of FIG. 3, and again using (43) above, the cubic coefficient value α may, in the example of FIG. 9, be determined based on the conductance value (operation 912). The processor implementing VOC as described herein may be configured to implement a cubic voltage-dependent current source based on the cubic coefficient value (operation 914). For example, control unit 710 may be configured to implement virtual cubic voltage-dependent current source 726 of virtual oscillator 712 to multiply the cubed voltage by α.

In the example of FIG. 9, the capacitance value may be determined (operation 916). To quantify the dynamic response of the VO-controlled inverter, the terminal voltage rise time to the open-circuit voltage can be analyzed. As before, the rise time, $t_{rise}$ is defined as the time taken for the inverter terminal voltage to rise from $0.1\overline{V}_{oc}$ to $0.9\overline{V}_{oc}$. Furthermore, the harmonic content of the terminal voltage is captured and quantified through the ratio of the amplitude of the third harmonic to the fundamental, $\delta_{3:1}$. Following the analysis with respect to FIGS. 2 and 3 above for rise-time and harmonic content in the terminal voltage for an unloaded inverter, $$t_{rise} \approx \frac{6C}{\sigma}, \delta_{3:1} \approx \frac{\sigma}{8\omega C}, \tag{74}$$

where ω is the nominal frequency. Thus, upon imposing the design requirements (rise-time of 0.1 s, ratio of third-to-first harmonic 2%) results in the following from (74):

$$\frac{10}{192\pi} \leq \frac{C}{\sigma} \leq \frac{1}{60}. \tag{75}$$

Also, to ensure frequency-regulation of ±0.5 Hz, the following must hold:

$$C \geq \frac{1}{4\pi 0.5} \frac{\overline{V}_{oc}}{\overline{V}_{min}} \frac{\overline{P}_{rated}}{|\overline{Q}_{rated}|}, \tag{76}$$

where $\kappa_v$ and $\kappa_i$ from (72) have been substituted in (71) and where the worst-case operating condition is assumed (where maximum average power, $\overline{P}_{rated}$, is sourced at the minimum permissible terminal voltage, $\overline{V}_{min}$).

The processor implementing VOC as described herein may be configured to implement a virtual capacitor based on the capacitance value (operation 918). For example, control unit 710 may be configured to implement virtual capacitor 720 of virtual oscillator 712 using the capacitance value. For the specific example discussed here, a value of C=1019/60 F may be selected to satisfy the lower bound specified by (76).

Similar to operation 320 of FIG. 3, and again using (50) above, the inductance value L may be determined based on the capacitance value and a nominal system frequency (operation 920). The processor implementing VOC as described herein may be configured to implement a virtual inductor based on the inductance value (operation 922). For example, control unit 710 may be configured to implement virtual inductor 722 of virtual oscillator 712 using the inductance value.

The example operations of FIG. 9 constitute a design procedure through which a VO-controlled inverter may be configured to meet a specified set of AC performance specifications for inductive networks. Such procedure may, in some examples, be performed by design engineers as part of a design process, or may be performed by one or more systems or machines, such as those used for fabrication.

As one example, a design system may be configured to receive, as input, AC design specifications for a particular device (e.g., an inverter). The design system may perform the operations described with respect to FIG. 9 above, and thereby configure a digital controller or other processor to emulate a virtual oscillator as described herein to control the corresponding device. In this way, the design procedure disclosed herein may facilitate more efficient production of multiple devices having different AC design specifications.

Figure 10:
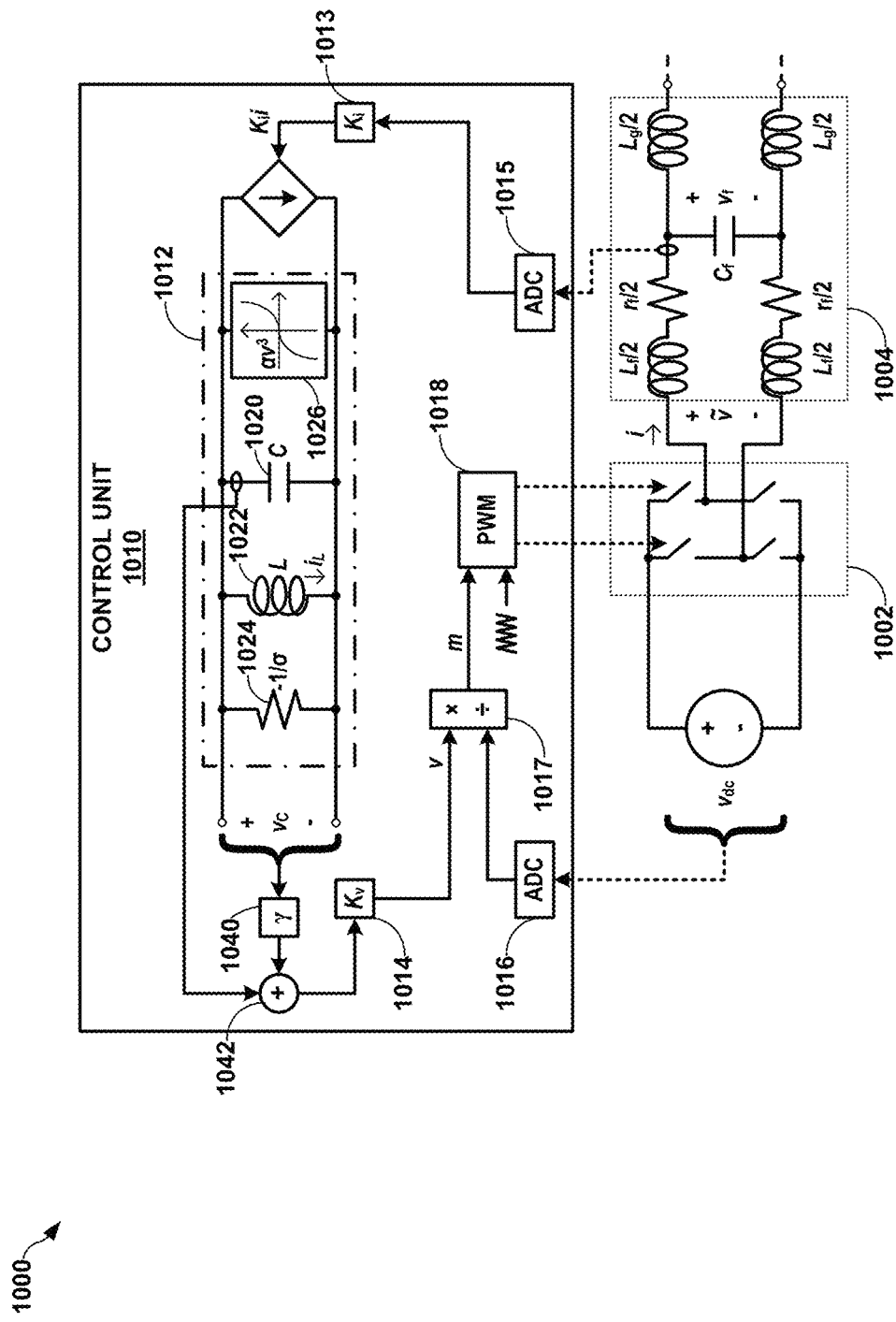
FIG. 10 is a circuit diagram illustrating another example of a single-phase power-electronic inverter implemented using VOC, in accordance with one or more aspects of the present disclosure.

FIG. 10 is a circuit diagram illustrating another example of a single-phase power-electronic inverter (e.g., inverter 1000) implemented using VOC, in accordance with one or more aspects of the present disclosure. Inverter 1000 builds upon inverter 200, shown in the example of FIG. 2, and provides an extension that allows for global asymptotic synchronization of inverters in uniform linear, time-invariant (LTI) electrical networks with arbitrary topologies. Inverter 1000 uses a particular feedback scheme. This implementation thereby provides a closed-loop system that is equivalent to a static diffusive interconnection. This allows for tailoring incremental-stability arguments to the particular setting of uniform electrical networks.

In the example of FIG. 10, inverter 1000 includes power electronics switches 1002, LCL output filter 2004, and control unit 1010. Control unit 1010 is configured to implement virtual oscillator 1012, current-scaling unit 1013, voltage-scaling unit 1014, ADCs 1015 and 1016, modulation unit 1017, and PWM unit 1018. Virtual oscillator 1012 includes virtual capacitor 1020, virtual inductor 1022, virtual negative-conductance element 1024, and virtual cubic voltage-dependent current source 1026. In the example of FIG. 10, components 1002, 1004, 1010, 1012, 1013, 1014, 1015, 1016, 1017, 1018, 1020, 1022, 1024, and 1026 may have functionality similar to that of components 202, 204, 210, 212, 213, 214, 215, 216, 217, 218, 220, 222, 224, and 226 as shown FIG. 2, respectively.

Of note, in the example of FIG. 10, LCL output filter 1004 includes two resistors, each having a resistance of $r_f/2$. These resistances represent the intrinsic line resistance of the respective branch. These resistances may also be present in one or more other example inverters described herein but, for brevity, are not shown.

In the example of FIG. 10, control unit 1010 is further configured to implement voltage-scaling unit 1040 and summing unit 1042. Voltage-scaling unit 1040 is configured to scale an output voltage $v_C$ of virtual oscillator 1012 by a voltage scaling factor, $\gamma$. This voltage scaling factor is a constant that is determined based on the inductance value $L_f$ and resistance value $r_f$ of the inverter-side branch for inverter 1000 (e.g., output filter 1004). Specifically, $$\gamma \geq \frac{r_f}{L_f}. \tag{77}$$

Summing unit 1042 adds the resulting scaled voltage, $\gamma v_C$, to the current through virtual capacitor 1020, $i_C$, and provides the resulting sum, $\gamma v_C + i_C$ to voltage-scaling unit 1014.

With the additional implementation of voltage-scaling unit 1040 and summing unit 1042, inverter 1000 can be shown to be globally asymptotically stable. That is, inverter 1000 may achieve global asymptotic synchronization.

Figure 11:
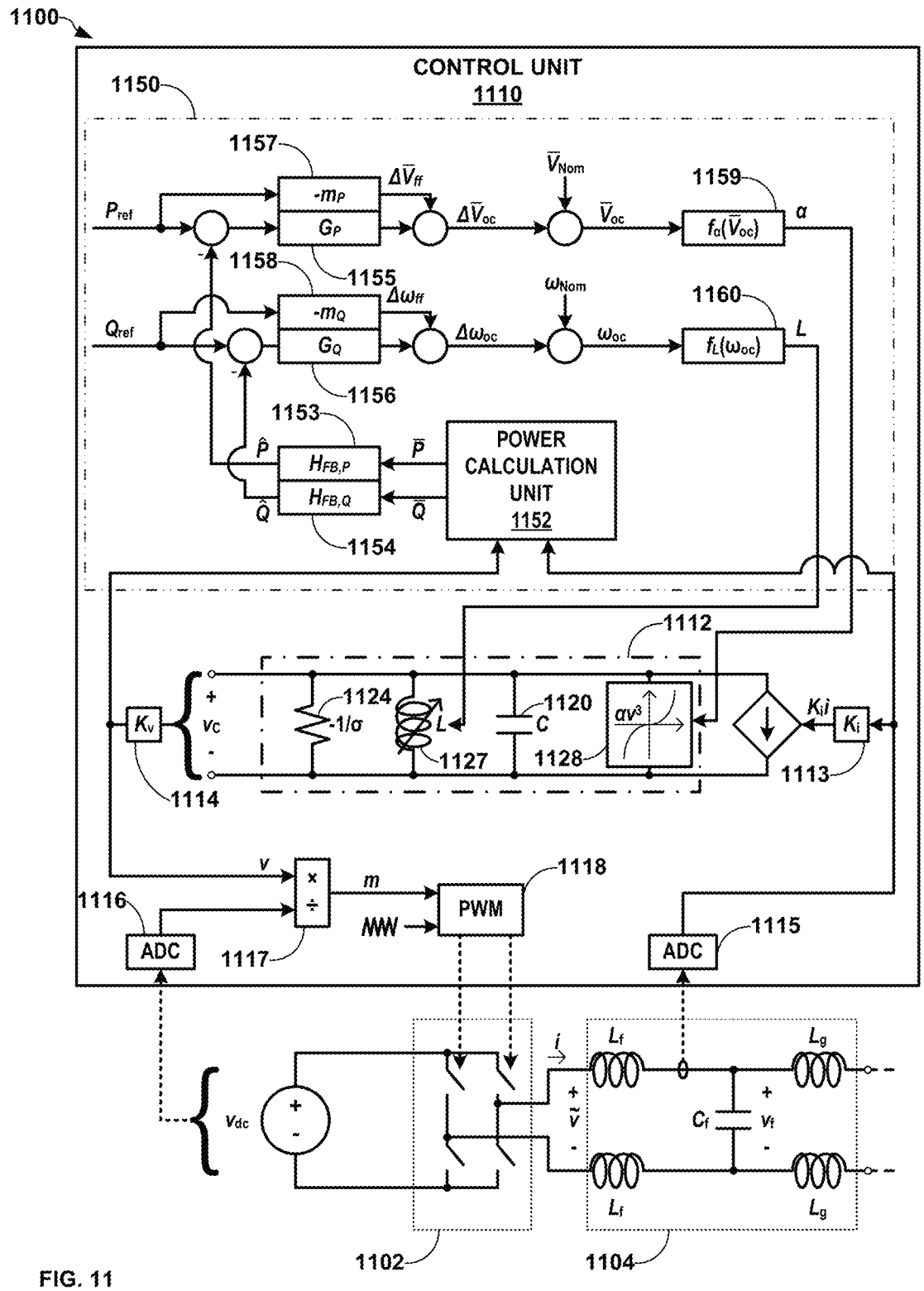
FIG. 11 is a circuit diagram illustrating another example of a single-phase power-electronic inverter implemented using VOC, in accordance with one or more aspects of the present disclosure.

FIG. 11 is a circuit diagram illustrating another example of a single-phase power-electronic inverter (e.g., inverter 1100) implemented using VOC, in accordance with one or more aspects of the present disclosure. Inverter 1100 builds upon inverter 200, shown in the example of FIG. 2, and provides an extension that allows for power-tracking capability. That is, inverter 1100 may be able to regulate the power output to match that available from the primary DC source. Inverter 1100 may adaptively adjust the parameters of the underlying VOC to regulate its output power via feedforward linearization.

In the example of FIG. 11, inverter 1100 includes power electronics switches 1102, LCL output filter 1104, and control unit 1110. Control unit 1110 is configured to implement virtual oscillator 1112, current-scaling unit 1113, voltage-scaling unit 1114, ADCs 1115 and 1116, modulation unit 1117, and PWM unit 1118. Virtual oscillator 1112 includes virtual capacitor 1120, virtual variable inductor 1122, virtual negative-conductance element 1124, and virtual variable cubic voltage-dependent current source 1126. Components 1102, 1104, 1110, 1112, 1113, 1114, 1115, 1116, 1117, 1118, 1120, and 1124 may have functionality similar to that of components 202, 204, 210, 212, 213, 214, 215, 216, 217, 218, 220, and 224 as shown FIG. 2, respectively.

In the example of FIG. 11, however, control unit 1110 is configured to implement the virtual inductor and virtual cubic voltage-dependent current source within the virtual oscillator 1112 in a variable fashion (e.g., virtual variable inductor 1127 and virtual variable cubic voltage-dependent current source 1128). Furthermore, control unit 1110 is configured to also implement power tracking control unit 1150 to control the variable nature of virtual variable inductor 1127 and virtual variable cubic voltage-dependent current source 1128. This may allow inverter 1100 to track a specified real and reactive power reference while maintaining its "grid-forming" behaviors. These additional features may be necessary, in some cases, to match the capabilities of the primary DC energy source (such as a photovoltaic array or battery).

The addition of power-tracking control unit 1150 provides an outer control loop that adaptively modifies the parameters of the VOC control techniques to adjust the output power of inverter 1100. In addition, a feedforward linearization is used to linearize the power-tracking dynamics and to allow power-tracking control to be designed with specified dynamic behavior. A closed-form procedure to design a power-tracking VOC inverter such as inverter 1100 to meet specified stability margins is further described below with respect to FIG. 12.

As a corollary to the analysis of FIG. 2, and with a few slight changes in notation, it can be shown by singularperturbation and averaging techniques that the AC voltage magnitude and phase of $v=\tilde{v}$ in inverter 200 follow the dynamics:

$$\frac{d}{dt}\overline{V} = \frac{\sigma}{2C}\left(\overline{V} - \frac{\sigma}{V_{oc}^2}\overline{V}^3\right) - \frac{\kappa_v\kappa_i}{2C\overline{V}}\overline{P} \quad (78)$$

$$\frac{d}{dt}\overline{\theta} = \omega_{oc} - \omega + \frac{\kappa_v\kappa_i}{2C\overline{V}^2}\overline{Q}, \quad (79)$$

where $\overline{V}$ and $\overline{\theta}$ are the AC-cycle-average inverter voltage magnitude and synchronous phase, $\overline{P}$ and $\overline{Q}$ are the inverter real and reactive output power, and $\omega$ is the system frequency. The open-circuit parameters $V_{oc}$ and $\omega_{oc}$ are found by:

$$V_{oc} = \kappa_v\sqrt{\frac{2\sigma}{3\alpha}}, \quad (80)$$

$$\omega_{oc} = \frac{1}{\sqrt{LC}}. \quad (81)$$

The equilibria of (78) and (79) were also compared above to the standard universal droop $$\overline{V}_{eq} = \overline{V}_{oc} + m_P\overline{P}_{eq}, \quad (82)$$

$$\omega_{eq} = \omega_{oc} + m_Q\overline{Q}_{eq}, \quad (83)$$

where $\overline{V}_{eq}$ and $\omega_{eq}$ are the equilibrium voltage and frequency, $m_P<0$ is the active-power droop coefficient, and $m_Q>0$ is the reactive-power droop coefficient. It can further be shown that the equilibria of (78) and (79) track (82) and (83) with less than 1% error for the following selections of $m_P$ and $m_Q$:

$$m_P = \frac{\kappa_v\kappa_i}{2\sigma}V_{Nom}(1-2\sigma)^{-1}, \quad (84)$$

$$m_Q = \frac{\kappa_v\kappa_i}{2CV_{Nom}^2}, \quad (85)$$

where $V_{Nom}$ is the system nominal AC voltage.

In summary, while the relationship between the fundamental VOC parameters σ, α, L, and C) to the equilibrium states ($\overline{V}_{eq}$, $\omega_{eq}$, $\overline{P}_{eq}$, $\overline{Q}_{eq}$) are highly nonlinear, the open-circuit parameters $V_{oc}$ and $\omega_{oc}$ provide a method of establishing a simple linear relationship between the VOC characteristics and the equilibrium states. These relationships form the basis of the VOC-based power-tracking control techniques described with respect to FIG. 11 herein.

In some examples, a VOC-based power-tracking inverter such as inverter 1100 may be based on a feedforward-linearization approach. One purpose of these techniques may be to allow a VOC-controlled inverter to track a reference of real and reactive power while maintaining the "grid-forming" nature of VOC. This can be accomplished by a real-time modulation of the VOC fundamental parameters α and L in order to regulate inverter real and reactive output power.

Because the relationship of the fundamental parameters with real and reactive power $\overline{P}_{eq}$ and $\overline{Q}_{eq}$ is highly nonlinear (as shown in (78) and (79)), it may be difficult to control real and reactive power with them directly. However, the open-circuit parameters $V_{oc}$ and $\omega_{oc}$ are linearly related to $\overline{P}_{eq}$ and $\overline{Q}_{eq}$ by (82) and (83). These relationships allow the design of linear control techniques with feedforward to determine $\overline{V}_{oc}$ and $\omega_{oc}$ to achieve the desired $\overline{P}_{eq}$ and $\overline{Q}_{eq}$. The VOC fundamental parameters σ, α, L, and C can then be calculated from $\overline{V}_{oc}$ and $\omega_{oc}$ by (80) and (81).

The feedforward-linearization approach used by inverter 1100 is based on the relationships described above. The control signals $\Delta\overline{V}_{oc}$ and $\Delta\omega_{oc}$ may be defined as follows:

$$\Delta\overline{V}_{oc} := \overline{V}_{oc} - \overline{V}_{Nom}, \quad (86)$$

$$\Delta\overline{\omega}_{oc} := \omega_{oc} - \omega_{Nom}, \quad (86)$$

where $\overline{V}_{Nom}$ and $\omega_{Nom}$ are the nominal voltage and frequency at the inverter terminals. Substituting (86) and (87) into (82) and (83) and solving for $\overline{P}_{eq}$ and $\overline{Q}_{eq}$ results in the following equilibrium relationships:

$$\overline{P}_{eq} := -m_P^{-1}\Delta\overline{V}_{oc} + m_P^{-1}(\overline{V}_{eq} - \overline{V}_{Nom}), \quad (88)$$

$$\overline{Q}_{eq} := -m_Q^{-1}\Delta\omega_{oc} + m_Q^{-1}(\omega_{eq} - \omega_{Nom}). \quad (89)$$

The feedfoward linearization is accomplished by application of (80) and (81) to transform the open-circuit parameters $\overline{V}_{oc}$ and $\omega_{oc}$ (which are linearly related to $\overline{P}_{eq}$ and $\overline{Q}_{eq}$) into the VOC fundamental parameters σ, α, L, and C. To completely define the four VOC fundamental parameters (80) and (81) must be supplemented with two additional algebraic constraints. In addition, from (80) and (81) it is clear that adjusting the values of σ and C will affect the droop slopes $m_P$ and $m_Q$, which are desired to be fixed (since these linear relationships will form the basis of the linearized control).

By performing the VOC design procedure detailed with respect to FIG. 3 above, a "nominal" set of fixed VOC parameters $\sigma_{Nom}$, $\alpha_{Nom}$, $L_{Nom}$, and $C_{Nom}$ are obtained that achieve a set of specified AC performance targets. The value of σ may be fixed at $\sigma_{Nom}$ in order to fix the droop slope $m_P$, and similarly the value of C may be fixed at $C_{Nom}$ in order to fix $m_Q$. That is, in FIG. 11, the conductance of virtual negative conductance element 1124 and the capacitance of virtual capacitance 1120 may be fixed at $-1/\sigma_{Nom}$ and $C_{Nom}$, respectively. Therefore, solving (80) and (81) for α and L respectively for fixed σ and C, results in:

$$\alpha = \frac{2}{3}\frac{\kappa_v^2}{\overline{V}_{oc}^2\sigma_{Nom}} =: f_\alpha(\overline{V}_{oc}), \quad (90)$$

$$L = \frac{1}{\omega_{oc}^2 C_{Nom}} =: f_L(\omega_{oc}). \quad (91)$$

The nonlinear functions $f_\alpha(\overline{V}_{oc})$ and $f_L(\omega_{oc})$ above allow the VOC fundamental parameters α and L to be calculated from the control variables $\overline{V}_{oc}$ and $\omega_{oc}$. In addition, since $\overline{V}_{oc}$ and $\omega_{oc}$ are linearly related to $\overline{P}_{eq}$ and $\overline{Q}_{eq}$, (90) and (91) constitute a feedforward linearization of the VOC real and reactive power dynamics.

In the example of FIG. 11, control unit 1110 operates using techniques similar to the VOC control techniques described with respect to FIG. 2 above, but with dynamically-defined parameters α and L for virtual variable inductance 1127 and virtual variable cubic voltage-dependent current source 1128, respectively. σ and C are fixed at their nominal values.

Power tracking control unit 1150, in the example of FIG. 11, includes power calculation unit 1152, power feedback filters 1153 and 1154, feedforward units 1155 and 1156, linear compensators 1157 and 1158, and nonlinear operators 1159 and 1160. Power tracking unit 1150 acts as an outer loop to the VOC and adaptively modulates a and L to regulate $\overline{P}$ and $\overline{Q}$ to track the specified $P_{ref}$ and $Q_{ref}$.

Power calculation unit 1152 receives the inverter output current and the scaled output voltage of virtual oscillator 1112 and determines the current real and reactive powers being output by inverter 1100. For a single-phase inverter, the measured real and reactive power $\overline{P}$ and $\overline{Q}$ are calculated from $v$ and $i$ of the VOC as follows:

$$\overline{P} = v\,i - \text{Hil}(v)\text{Hil}(i) \qquad (92)$$

$$\overline{P} = \text{Hil}(v)\,i + v\,\text{Hil}(i) \qquad (93)$$

where Hil(•) represents the Hilbert transform for generation of an orthogonal signal. For a three-phase inverter, (92) and (93) can be replaced by a three-phase power calculation method.

In the example of FIG. 11, power feedback filters 1153 and 1154, implementing $H_{FB,P}$ and $H_{FB,Q}$, respectively, may receive the respective power measurements from power calculation unit 1152 and filter out harmonic content therefrom. As one example, $H_{FB,P}=H_{FB,Q}$ may be selected as a moving average filter with a window equal to one nominal AC cycle period ($T_{AC}=2\pi/\omega_{Nom}$). Linear compensators 1157 and 1158 ($G_P$ and $G_Q$, respectively) may operate on the real and reactive power error signals (e.g., $P_{ref}-\hat{P}$ and $Q_{ref}-\hat{Q}$, respectively) to produce, after summation with a feedforward term, the control signals $\Delta\overline{V}_{oc}$ and $\Delta\omega_{oc}$. Further details of linear compensators 1157 and 1158 are provided below with respect to FIG. 12. The control signals $\Delta\overline{V}_{oc}$ and $\Delta\omega_{oc}$ are then summed with their respective nominal values to generate $\overline{V}_{oc}$ and $\omega_{oc}$.

Nonlinear operators 1159 and 1160 respectively implement functions $f_\alpha(\overline{V}_{oc})$ and $f_L(\omega_{oc})$ as defined in (90) and (91) to provide feedforward linearization and generate the VOC fundamental parameters α and L. These are then dynamically fed into virtual variable inductance 1127 and virtual variable cubic voltage-dependent current source 1128, respectively.

Feedforward units 1157 and 1158 multiply their respective inputs by the terms $-m_P$ and $-m_Q$, respectively. $-m_P$ and $-m_Q$ represent the nominal relationship of voltage to real power and frequency to reactive power respectively. Rearranging (82) and (83) substituting $\overline{P}=P_{ref}$, $\overline{Q}=Q_{ref}$, $\overline{V}_{eq}=\overline{V}_{Nom}$, and $\omega_{eq}=\omega_{Nom}$ results in $$\Delta\overline{V}_{ff} = \overline{V}_{oc} - \overline{V}_{Nom} = -m_P P_{ref} \qquad (94)$$

$$\Delta\omega_{ff} = \omega_{oc} - \omega_{Nom} = -m_Q Q_{ref} \qquad (95)$$

The feedforward linearization technique described herein decouples the nonlinearity of the relationship between the VOC fundamental parameters and its equilibrium states, thereby allowing power-tracking control to be designed based on the linear relationships in (82) and (83). However, (82) and (83) are algebraic equations describing the VOC equilibrium response, not dynamic equations describing its transient response. In order to design power-tracking control to meet desired time-domain response specifications (such as rise time, overshoot, etc.), it may be necessary to model the (feedforward-linearized) VOC real and reactive power dynamics.

It has been shown with respect to FIGS. 2 and 3 above that a VOC-controlled inverter exhibits a voltage rise time $t_{rise}$ that can be approximated as $$t_{rise} \approx 6\frac{C}{\sigma}. \qquad (96)$$

It was further observed from simulation and experiment that the VOC power dynamics exhibit a first-order response with similar rise time. Thus the dynamics of the relationship between the control variables $\Delta\overline{V}_{oc}$ and $\Delta\omega_{oc}$ and the inverter real and reactive power $\overline{P}$ and $\overline{Q}$ may be approximated by substituting (86) and (87) into (82) and (83) and assuming a first order response with rise time $t_{rise}$ as follows:

$$\overline{P}(s) = -m_P^{-1}\frac{\omega_c}{s+\omega_c}(\Delta\overline{V}_{oc}(s) + \overline{V}(s) - \overline{V}_{Nom}), \qquad (97)$$

$$\overline{Q}(s) = -m_Q^{-1}\frac{\omega_c}{s+\omega_c}(\Delta\omega_{oc}(s) + \omega(s) - \omega_{Nom}), \qquad (98)$$

where $\omega_c=2\pi/(3t_{rise})$ is the cutoff frequency of the first-order response and s is the Laplace variable. In the calculation of $\omega_c$, the rise time of the first-order filter has been assumed to be equal to three times its time constant.

Figure 12:
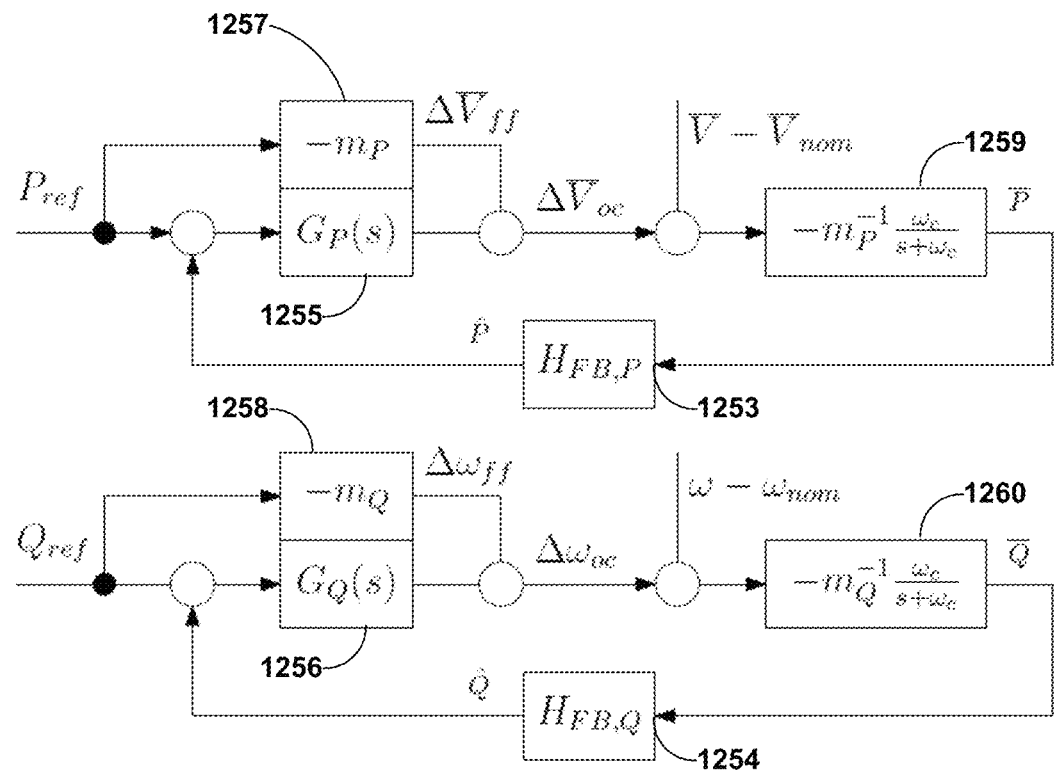
FIG. 12 is a block diagram illustrating one example of a dynamic model of a power-tracking loop, in accordance with one or more aspects of the present disclosure.

FIG. 12 is a block diagram illustrating one example of a dynamic model of a power-tracking loop (e.g., based on the feedforward-linearized model of the VOC power response in (97) and (98)), in accordance with one or more aspects of the present disclosure. FIG. 12 includes power feedback filters 1253 and 1254, feedforward units 1255 and 1256, linear compensators 1257 and 1258, and nonlinear operators 1259 and 1260. Components 1253-1260 represent operations similar to the functionality of components 1153-1160 shown in FIG. 11, respectively.

A first step in one example design procedure for VOC-based power-tracking control aiming to achieve a set of specified AC and dynamic performance targets is the selection of a set of "nominal" VOC fundamental parameters ($\sigma_{Nom}$, $\alpha_{Nom}$, $L_{Nom}$, and $C_{Nom}$) to achieve the specified AC performance criteria. This set of parameters represents the value of the VOC parameters when $\Delta\overline{V}_{oc}=\Delta\omega_{oc}=0$. Table IV defines an example set of AC and dynamic performance targets.

TABLE IV

EXAMPLE AC AND DYNAMIC PERFORMANCE SPECIFICATIONS

| Symbol | Description | Value | Units |
|---|---|---|---|
| $P_{rated}$ | Inverter Rated Real Power | 750 | W |
| $|Q_{rated}|$ | Inverter Rated Reactive Power | 750 | VAr |
| $V_{Nom}$ | Nominal Voltage Magnitude | 120 | Vrms |
| $V_{min}$ | Minimum Voltage Magnitude | 114 | Vrms |
| $\omega_{Nom}$ | Nominal AC Frequency | 2π60 | rad/sec |
| $|\Delta\omega_{max}|$ | Maximum Frequency Offset | 2π0.5 | rad/sec |
| $t_{rise}$ | VOC Rise Time | 0.05 | sec |
| $\phi_{PM}$ | Power-Tracking Phase Margin | 65 | degrees |

Based on the example AC and dynamic performance targets, a set of nominal VOC fundamental parameters may be determined by following the VOC design procedure detailed with respect to FIG. 3, above. These values will inform the design of the VOC-based power-tracking control described here. The nominal VOC fundamental parameters (determined by the method presented in FIG. 3) are shown in Table V below.

Next, the design of the linear compensators (e.g., 1155 and 1156 of FIG. 11), implementing $G_P(s)$ and $G_Q(s)$, respectively, may be determined based on the feedforward-linearized model in FIG. 12. The open-loop transfer function of the real-power-tracking loop can be written as $$G_{OL,P}(s) = -G_P(s) m_P^{-1} \frac{\omega_c}{s + \omega_c} H_{FB,P}(s). \tag{99}$$

The compensator $G_P(s)$ is selected as a series Proportional-Integral controller of the form $$G_P(s) = \kappa_{p,P}\left(1 + \kappa_{i,P}\frac{1}{s}\right) = \kappa_{p,P}\frac{s + \kappa_{i,P}}{s}. \tag{100}$$

where $\kappa_{p,P}$ and $\kappa_{i,P}$ are the proportional and integral gains Whose values are to be designed.

For brevity, the transfer function of the power feedback filter $H_{FB,P}$ is approximated as a delay equal to half the AC period $T_{AC}/2$:

$$H_{FB,P}(s) = H_{FB,Q}(s) \approx e^{-sT_{AC}/2}. \tag{101}$$

This approximation is accurate for frequencies below half the AC frequency, which is the range of interest for power-tracking control.

Substituting (100) and (101) into (99) yields $$G_{OL,P}(s) = -\kappa_{p,P} m_P^{-1} \frac{\omega_c(s + \kappa_{i,P})}{s(s + \omega_c)} e^{-sT_{AC}/2}. \tag{102}$$

The assignment $\kappa_{i,P} = \omega_C$ simplifies (102) to $$G_{OL,P}(s) = -\kappa_{p,P} m_P^{-1} \frac{\omega_c}{s} e^{-sT_{AC}/2}. \tag{103}$$

To determine the proportional gain $\kappa_{p,P}$, a target phase margin $$\phi_{PM} \in \left[\frac{\pi}{4}, \pi\right]$$

must first be selected. Evaluating (103) at $s=j\omega$ and separating into magnitude and phase results in $$|G_{OL,P}(j\omega)| = \left|\kappa_{p,P} m_P^{-1} \frac{\omega_c}{\omega}\right|, \tag{104}$$

$$\angle G_{OL,P}(j\omega) = \tan^{-1}\left(\frac{\cos(\omega T_{AC}/2)}{\sin(\omega T_{AC}/2)}\right) = \left(\frac{\omega T_{AC}}{2} + \frac{\pi}{2}\right). \tag{105}$$

Setting (105) equal to $-\pi + \phi_{PM}$ and solving for $\omega$ yields the target gain crossover frequency $\omega_{GC}$:

$$\omega_{GC} = \frac{\pi}{T} - \frac{2}{T}\phi_{PM}. \tag{106}$$

Finally, (104) is evaluated at $\omega = \omega_{GC}$ and set equal to unity to find the value of $\kappa_{p,P}$ to yield the target phase margin:

$$\kappa_{p,P} = \left|m_P \frac{\omega_{GC}}{\omega_c}\right|. \tag{107}$$

Applying the same procedure to the reactive power-tracking loop results in the value of $\kappa_{p,Q}$ that yields the same phase margin (assuming $\kappa_{i,Q} = \kappa_{i,P} = \omega_c$):

$$\kappa_{p,Q} = \left|m_Q \frac{\omega_{GC}}{\omega_c}\right|. \tag{108}$$

The power-tracking parameters for the candidate design that result from the above example design procedure are also shown in Table V. These parameters were calculated based on the AC and dynamic performance targets shown in Table IV above.

TABLE V

DESIGN VOC AND POWER-TRACKING PARAMETERS

| Symbol | Description | Value | Units |
|---|---|---|---|
| $\sigma_{Nom}$ | VOC Conductance | 10.7962 | Ohms$^{-1}$ |
| $\alpha_{Nom}$ | VOC Cubic Coefficient | 7.1975 | A/V$^{-3}$ |
| $L_{Nom}$ | VOC Inductance | 39.899 | μH |
| $C_{Nom}$ | VOC Capacitance | 176.35 | mF |
| $m_P$ | P-V Droop Slope | −7.410e−3 | V/W |
| $m_Q$ | Q-ω Droop Slope | 3.780e−3 | rad/sec/VAr |
| $\omega_c$ | Cutoff Frequency | 2π6.583 | rad/sec |
| $\omega_{GC}$ | Gain Crossover Frequency | 2π8.33 | rad/sec |
| $\kappa_{p,P}$ | P Proportional Gain | 9.380e−3 | V/W |
| $\kappa_{i,P}$ | P Integral Gain | 2π6.583 | rad/sec |
| $\kappa_{p,Q}$ | Q Proportional Gain | 4.786e−3 | rad/sec/VAr |
| $\kappa_{i,Q}$ | Q Integral Gain | 2π6.583 | rad/sec |

As validation of the proposed VOC-based power-tracking designs disclosed herein, control unit 1110 of FIG. 11 was implemented in a digital microcontroller for a single-phase test inverter with the parameters presented in Table V. The test inverter was connected to a stiff 120 V AC voltage source (e.g., representing a mains utility connection) with a series impedance $Z_g = R_g + j\omega L_g$. The value of $Z_g$ was selected so that it represents a 5% impedance on the basis of the inverter specifications with an X/R ratio of unity. This may represent a typical case in which an inverter is located at the end of a long underground distribution feeder line.

The test system was constructed in the Energy Systems Integration Facility (ESIF) at the National Renewable Energy Laboratory in Golden, Colo. The grid was operated at nominal voltage and frequency ($V_g$=120 Vrms and $\omega_{eq}$=2π60 rad/sec) and the inverter (with VOC and power-tracking enabled) was synchronized to the grid and connected. A sequence of inverter power reference steps was then commanded, and the resulting power-tracking performance of the inverter recorded.

Figure 13A:
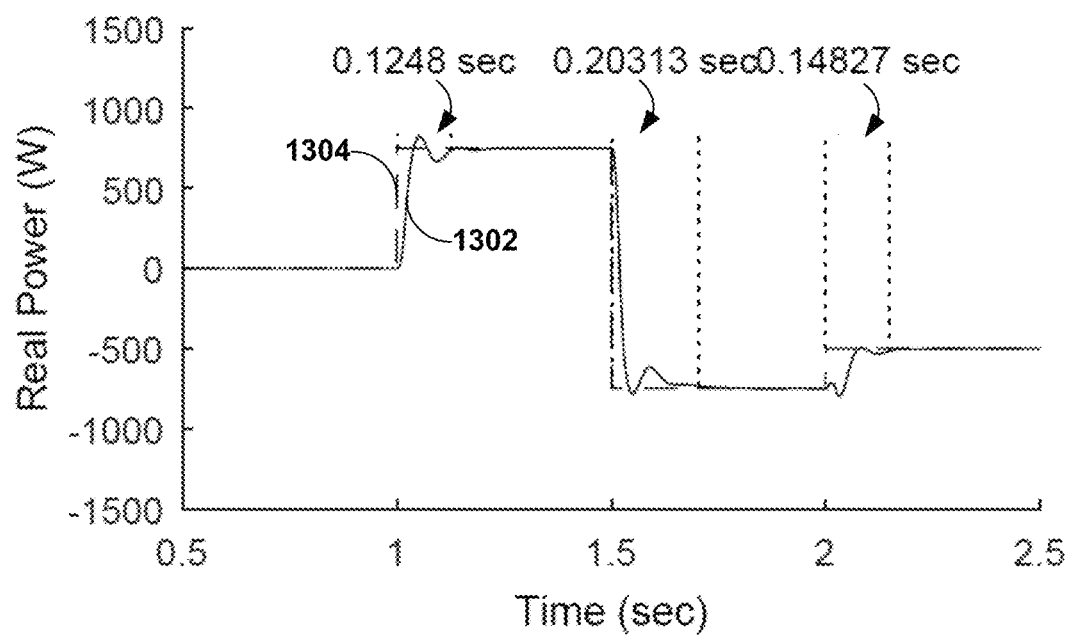
FIGS. 13A and 13B are graphical plots showing real and reactive power references and measured values for a prototype VOC-based power-tracking inverter, in accordance with one or more aspects of the present disclosure.
Figure 13B:
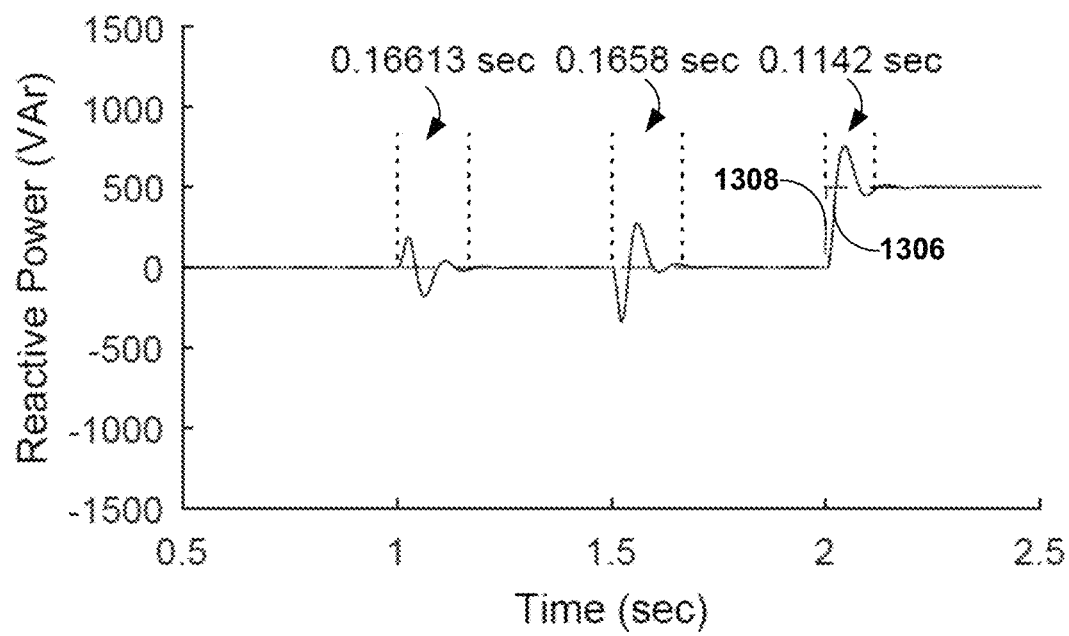

FIGS. 13A and 13B are graphical plots showing real and reactive power references and measured values for a prototype VOC-based power-tracking inverter, in accordance with one or more aspects of the present disclosure. In FIGS. 6A and 6B, solid lines 1302 and 1306 represent the actual real power ($\overline{P}$) and reactive power ($\overline{Q}$), respectively. Dotted lines 1304 and 1308 represent the reference real power ($P_{ref}$) and reactive power ($Q_{ref}$), respectively. Table VI shows the power reference steps and the resulting settling time, overshoot, and regulation error.

TABLE VI

QUANTITATIVE EXPERIMENT RESULTS

| Quantity | Unit | Step 1 | Step 2 | Step 3 | Worst Case |
|---|---|---|---|---|---|
| Step time | sec | 1.0 | 1.5 | 2.0 | N/A |
| $P_{ref}$ | W | 750 | −750 | −500 | N/A |
| $Q_{ref}$ | VAr | 0 | 0 | 500 | N/A |
| P final | W | 749.99 | −749.91 | −499.94 | N/A |
| Q final | VAr | −0.013 | 0.015 | 499.99 | N/A |
| P regulation error | % | 1.09e−3 | 1.14e−3 | 0.812e−3 | 1.14e−3 |
| Q regulation error | % | 1.17e−3 | 2.03e−3 | 1.49e−3 | 2.03e−3 |
| P settling time | sec | 0.1248 | 0.203 | 0.1483 | 0.2031 |
| Q settling time | sec | 0.1661 | 0.166 | 0.1142 | 0.1661 |
| P overshoot | % | 10.013 | 2.220 | 1.1963 | 10.013 |
| Q overshoot | % | 24.204 | 18.41 | 51.360 | 51.360 |

Observe in FIGS. 13A and 13B that when $P_{ref}$ and/or $Q_{ref}$ are stepped, $\overline{P}$ and $\overline{Q}$ both track their respective references with a slight overshoot and ringing. The maximum settling time is on the order of 200 msec, and the steady-state regulation error is near zero (see Table VI).

The overshoot of $\overline{P}$ is less than 10%, which is as expected from the design procedure (the selected $\varphi_{PM}$=65 deg phase margin should yield an overshoot of about 10%). The overshoot of $\overline{Q}$ is as much as 51%. This may be a result of inverter terminal voltage rise due to the unmodeled impedances of the inverter filter and the network.

The response of $\overline{Q}$ experiences significant ringing in response to the step of $P_{ref}$. This cross-coupling effect may be explained by inclusion of the effects of filter and network impedances in the model.

In one aspect, the techniques of the present disclosure provide enhanced VOC with power-tracking capability. The techniques described herein may adaptively adjust the parameters of the underlying VOC to regulate real and reactive power. The control behavior may be linearized by use of a feedforward linearization. A linearized model of the control dynamics is provided herein, along with a method for designing the control to meet specified AC and dynamic performance targets. Furthermore, experimental validation of one example control implementation was performed in a single-phase, grid-tied test inverter system.

The example control setup successfully regulated the inverter's real and reactive output power to track the specified references with near-zero steady-state error. Dynamic performance of the control prototype was similar to that predicted by the proposed model. The overshoot of reactive power was larger than expected. In addition, some cross-coupling was observed between real and reactive power. The control prototype successfully met target performance criteria with settling time on the order of 200 msec.

In some examples, the control techniques described herein may be modified to ensure that they maintain VOC's "grid-forming" behaviors such as synchronization and maintaining voltage and frequency within specified limits. In addition, the control techniques of the present disclosure may, in some examples, be used as the basis for the design of VOC-based control for specific types of distributed generation, such as photovoltaics or battery energy storage systems. This may result in a systemic solution to the challenges of power-electronic-dominated distribution feeders.

While described herein within the context of inverters (e.g., for PV system outputs), the techniques of the present disclosure may be utilized in various other contexts where virtual-oscillator-based power-tracking control may be beneficial. These additional contexts may include use of the techniques of the present disclosure in any power-electronic systems, such as those of power generation sources, power consumption sources, power storage sources, or any combination thereof.

The following examples may additionally or alternatively describe the techniques of the present disclosure Example 1

A device comprising: a processor configured to implement a virtual oscillator circuit and output an oscillating waveform based on the virtual oscillator circuit; and power electronics operatively coupled to the processor and configured to convert, based on the oscillating waveform, direct current (DC) electricity to alternating current (AC) electricity, wherein the processor is further configured to: extract, from the virtual oscillator circuit, a virtual current based on an output current of the AC electricity, and output the oscillating waveform further based on an input voltage of the DC electricity.

Example 2

The device of example 1, wherein the virtual oscillator circuit comprises a virtual negative-conductance element.

Example 3

The device of example 2, wherein: the virtual oscillator circuit further comprises a virtual inductor and a virtual capacitor, and the virtual negative-conductance element, the virtual inductor, and the virtual capacitor are connected in parallel.

Example 4

The device of any of examples 1-3, wherein the virtual oscillator circuit comprises a virtual cubic voltage-dependent current source.

Example 5

The device of example 4, wherein: the virtual oscillator circuit further comprises a virtual inductor and a virtual capacitor, and the virtual cubic voltage-dependent current source, the virtual inductor, and the virtual capacitor are connected in parallel.

Example 6

The device of example 5, wherein the virtual cubic voltage-dependent current source consumes current proportional to a virtual voltage across the virtual capacitor.

Example 7

The device of any of examples 5-6, wherein the virtual oscillator circuit further comprises a virtual negative-conductance element that is connected in parallel with the virtual cubic voltage-dependent current source, the virtual inductor, and the virtual capacitor.

Example 8

The device of any of examples 1-7, wherein the processor is configured to output the oscillating waveform by: receiving, from the virtual oscillator circuit, a virtual output voltage; scaling the virtual output voltage based on the input voltage of the DC electricity to produce a scaled virtual output voltage; and comparing the scaled virtual output voltage to a carrier wave to produce the oscillating waveform.

Example 9

The device of any of examples 18, wherein: the virtual oscillator circuit comprises a virtual inductor and a virtual capacitor, and the processor is further configured to: compute a linear combination of a virtual voltage across the virtual capacitor and a virtual current through the virtual inductor to produce an alternate virtual output voltage; and output the oscillating waveform further based on the alternate virtual output voltage.

Example 10

The device of example 9, wherein the linear combination is computed as $\kappa_v v_c \cos \omega + \kappa_v \epsilon i_L \sin \varphi$ wherein: $\kappa_v$ represents a voltage scaling factor, $v_c$ represents the virtual voltage across the virtual capacitor, $\varphi$ represents a rotation angle, $\epsilon$ represents a current scaling factor, and $i_L$ represents the virtual current through the virtual inductor.

Example 11

The device of any of examples 1-10, further comprising an output filter that includes a filter inductor and has a resistance, wherein: the virtual oscillator circuit comprises a virtual capacitor, and the processor is configured to output the oscillating waveform by: receiving, from the virtual oscillator circuit, a virtual output voltage; scaling the virtual output voltage based on a value of the resistance and an inductance value of the filter inductor to produce a first scaled virtual output voltage; combining the first scaled virtual output voltage with a virtual capacitor current flowing through the virtual capacitor to produce a combined virtual output voltage; and outputting the oscillating waveform further based on the combined virtual output voltage.

Example 12

The device of any of examples 1-11, wherein: the virtual oscillator circuit comprises a virtual inductor and a virtual cubic voltage-dependent current source, and the processor is further configured to implement a power tracking control unit that modifies at least one of a virtual inductance of the virtual inductor or a scaling factor of the virtual cubic voltage-dependent current source based on a specified output power.

Example 13

The device of example 12, wherein the power tracking control unit modifies the at least one of the virtual inductance or the scaling factor based further on a scaled virtual output voltage of the virtual oscillator circuit and the output current of the AC electricity.

Example 14

The device of any of examples 1-13, wherein the power electronics are configured to convert the DC electricity to AC electricity by alternatively engaging and disengaging power electronics switches based on the oscillating waveform.

Example 15

A device comprising: a processor configured to: implement a virtual oscillator circuit comprising a virtual capacitor, a virtual inductor, a virtual negative-conductance element, and a virtual cubic voltage dependent current source; generate, based on the virtual oscillator circuit, an oscillating waveform; and output, based on the oscillating waveform, at least one control signal to cause power electronics to convert direct current (DC) electricity to alternating current (AC) electricity; receive an indication of an output current of the AC electricity; extract, from the virtual oscillator circuit, a virtual current based on the output current of the AC electricity; and receive an indication of an input voltage of the DC electricity, wherein the oscillating waveform is generated further based on the input voltage of the DC electricity.

Example 16

The device of example 15, wherein the processor is configured to: compute a linear combination of a virtual voltage across the virtual capacitor and a virtual current through the virtual inductor to produce an alternate virtual output voltage, and generate the oscillating waveform based on the alternate virtual output voltage.

Example 17

The device of any of examples 15-16, wherein the processor is further configured to modify at least one of a virtual inductance of the virtual inductor or a scaling factor of the virtual cubic voltage-dependent current source based on a specified output power and at least one of: a scaled virtual output voltage of the virtual oscillator circuit or the output current of the AC electricity.

Example 18

A method comprising: determining, for a processor operatively coupled to power electronics configured to convert direct current (DC) electricity to alternating current (AC) electricity, based on a specified open-circuit voltage value for the power electronics, a voltage scaling factor value, wherein the processor is configured to implement a virtual oscillator circuit comprising a virtual capacitor, a virtual inductor, a virtual negative-conductance element and a virtual cubic voltage-dependent current source; configuring the processor to scale, using the voltage scaling factor value, a virtual oscillator output voltage of the virtual oscillator circuit thereby producing a scaled virtual oscillator output voltage for use in controlling the power electronics; determining, for the processor, based on a specified rated power output value for the power electronics and a specified rated-power voltage value for the power electronics that corresponds to the specified rated power output value, a current scaling factor value; configuring the processor to generate a virtual oscillator input current by scaling, using the current scaling factor value, an output current of the power electronics; determining, for the processor, based on the specified open-circuit voltage value for the power electronics and the specified rated-power voltage value for the power electronics, a conductance value; configuring the processor to implement the virtual negative-conductance element based on the conductance value; determining, for the processor, based on the conductance value, a cubic coefficient value; configuring the processor to implement the virtual cubic voltage-dependent current source based on the cubic coefficient value; determining, for the processor, a capacitance value based on at least one of: (i) a specified rated reactive-power output value for the power electronics, (ii) a specified maximum frequency offset value, (iii) the specified rated power output value for the power electronics, (iv) the specified open-circuit voltage value for the power electronics, (v) the specified rated-power voltage value for the power electronics, (vi) a specified rise time value, (vii) a specified nominal system frequency value, or (viii) a specified ratio of an amplitude of a third harmonic to an amplitude of a fundamental; configuring the processor to implement the virtual capacitor based on the capacitance value; determining, for the processor, based on the capacitance value and the specified nominal system frequency value, an inductance value; and configuring the processor to implement the virtual inductor based on the inductance value.

Example 19

The method of example 18, wherein: the specified rated power output value for the power electronics comprises a specified rated real power output value for the power electronics, and the specified rated-power voltage value for the power electronics comprises a specified rated real-power voltage value for the power electronics.

Example 20

The method of example 18, wherein: the processor is further configured to implement a transformation unit that computes a linear combination of a voltage across the virtual capacitor and a current through the virtual inductor to produce an alternate virtual output voltage, the specified rated power output value for the power electronics comprises a specified rated reactive power output value for the power electronics, and the specified rated-power voltage value for the power electronics comprises a specified rated reactive-power voltage value for the power electronics.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media, which includes any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable storage medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of inter-operative hardware units, including one or more processors as described above, in conjunction with suitable software and/or firmware.

The foregoing disclosure includes various examples set forth merely as illustration. The disclosed examples are not intended to be limiting. Modifications incorporating the spirit and substance of the described examples may occur to persons skilled in the art. These and other examples are within the scope of this disclosure and the following claims.

What is claimed is:

1. A device comprising:
a processor configured to implement a virtual oscillator circuit and output an oscillating waveform based on the virtual oscillator circuit;
power electronics operatively coupled to the processor and configured to convert, based on the oscillating waveform, direct current (DC) electricity to alternating current (AC) electricity, wherein the processor is further configured to:
extract, from the virtual oscillator circuit, a virtual current based on an output current of the AC electricity, and output the oscillating waveform further based on an input voltage of the DC electricity; and an output filter that includes a filter inductor and that has a resistance, wherein:

the virtual oscillator circuit comprises a virtual capacitor, and the processor is configured to output the oscillating waveform by:

receiving, from the virtual oscillator circuit, a virtual output voltage;

scaling the virtual output voltage based on a value of the resistance and an inductance value of the filter inductor to produce a first scaled virtual output voltage;

combining the first scaled virtual output voltage with a virtual capacitor current flowing through the virtual capacitor to produce a combined virtual output voltage; and outputting the oscillating waveform further based on the combined virtual output voltage.

2. The device of claim 1, wherein the virtual oscillator circuit further comprises a virtual negative-conductance element.

3. The device of claim 2, wherein:

the virtual oscillator circuit further comprises a virtual inductor and a virtual capacitor, and the virtual negative-conductance element, the virtual inductor, and the virtual capacitor are connected in parallel.

4. The device of claim 1, wherein the virtual oscillator circuit further comprises a virtual cubic voltage-dependent current source.

5. The device of claim 4, wherein:

the virtual oscillator circuit further comprises a virtual inductor, and the virtual cubic voltage-dependent current source, the virtual inductor, and the virtual capacitor are connected in parallel.

6. The device of claim 5, wherein the virtual cubic voltage-dependent current source consumes current proportional to a virtual voltage across the virtual capacitor.

7. The device of claim 5, wherein the virtual oscillator circuit further comprises a virtual negative-conductance element that is connected in parallel with the virtual cubic voltage-dependent current source, the virtual inductor, and the virtual capacitor.

8. The device of claim 1, wherein the processor is configured to output the oscillating waveform by:

receiving, from the virtual oscillator circuit, a virtual output voltage;

scaling the virtual output voltage based on the input voltage of the DC electricity to produce a scaled virtual output voltage; and comparing the scaled virtual output voltage to a carrier wave to produce the oscillating waveform.

9. The device of claim 1, wherein:

the virtual oscillator circuit further comprises a virtual inductor, and the processor is further configured to:

compute a linear combination of a virtual voltage across the virtual capacitor and a virtual current through the virtual inductor to produce an alternate virtual output voltage; and output the oscillating waveform further based on the alternate virtual output voltage.

10. The device of claim 9, wherein the linear combination is computed as $\kappa_v v_c \cos \varphi + \kappa_v \epsilon i_L \sin \varphi$, wherein:

$\kappa_v$ represents a voltage scaling factor, $v_c$ represents the virtual voltage across the virtual capacitor, $\varphi$ represents a rotation angle, $\epsilon$ represents a current scaling factor, and $i_L$ represents the virtual current through the virtual inductor.

11. The device of claim 1, wherein:

the virtual oscillator circuit further comprises a virtual inductor and a virtual cubic voltage-dependent current source, and the processor is further configured to implement a power tracking control unit that modifies at least one of a virtual inductance of the virtual inductor or a scaling factor of the virtual cubic voltage-dependent current source based on a specified output power.

12. The device of claim 11, wherein the power tracking control unit modifies the at least one of the virtual inductance or the scaling factor based further on a scaled virtual output voltage of the virtual oscillator circuit and the output current of the AC electricity.

13. The device of claim 1, wherein the power electronics are configured to convert the DC electricity to AC electricity by alternatively engaging and disengaging power electronics switches based on the oscillating waveform.

* * * * *